US009711231B1

(12) United States Patent
Yip et al.

(10) Patent No.: US 9,711,231 B1
(45) Date of Patent: Jul. 18, 2017

(54) SYSTEM SOLUTION FOR FIRST READ ISSUE USING TIME DEPENDENT READ VOLTAGES

(71) Applicant: SanDisk Technologies LLC, Plano, TX (US)

(72) Inventors: Chris Yip, Saratoga, CA (US); Philip Reusswig, Mountain View, CA (US); Nian Niles Yang, Mountain View, CA (US); Grishma Shah, Milpitas, CA (US); Abuzer Azo Dogan, San Jose, CA (US); Biswajit Ray, Mountain View, CA (US); Mohan Dunga, Santa Clara, CA (US); Joanna Lai, San Jose, CA (US); Changyuan Chen, San Ramon, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/191,898

(22) Filed: Jun. 24, 2016

(51) Int. Cl.

| G11C 16/26 | (2006.01) |
|---|---|
| G11C 16/28 | (2006.01) |
| G11C 16/04 | (2006.01) |
| G11C 16/08 | (2006.01) |
| G11C 16/10 | (2006.01) |
| G11C 16/34 | (2006.01) |
| G06F 11/10 | (2006.01) |
| G11C 29/52 | (2006.01) |

(52) U.S. Cl.
CPC .......... *G11C 16/28* (2013.01); *G11C 16/0483* (2013.01); *G11C 16/08* (2013.01); *G11C 16/10* (2013.01); *G11C 16/3445* (2013.01); *G06F 11/1068* (2013.01); *G11C 29/52* (2013.01)

(58) Field of Classification Search
CPC .................. G11C 16/10; G11C 16/26
USPC ..................... 365/185.11, 185.24
See application file for complete search history.

(56) References Cited

U.S. PATENT DOCUMENTS

| 5,168,463 | A | * | 12/1992 | Ikeda | G11C 19/28 326/95 |
| 5,491,809 | A | * | 2/1996 | Coffman | G11C 16/22 365/218 |
| 5,555,527 | A | * | 9/1996 | Kotani | G11C 11/406 365/189.15 |

(Continued)

OTHER PUBLICATIONS

U.S. Appl. No. 15/182,853, filed Jun. 15, 2016.
U.S. Appl. No. 15/333,440, filed Oct. 25, 2016.

*Primary Examiner* — Michael Tran
(74) *Attorney, Agent, or Firm* — Vierra Magen Marcus LLP

(57) ABSTRACT

Techniques are provided for improving the accuracy of read operations of memory cells, where the threshold voltage of a memory cell can shift depending on when the read operation occurs. In one aspect, read voltages are set and optimized based on a time period since a last sensing operation. A timing device such as an n-bit digital counter may be provided for each block of memory cells to track the time. The counter is set to all 1's when the device is powered on. When a sensing operation occurs, the counter is periodically incremented based on a clock. When a next read operation occurs, the value of the counter is cross-referenced to an optimal set of read voltage shifts. Each block of cells may have its own counter, where the counters are incremented using a local or global clock.

20 Claims, 32 Drawing Sheets

(56) References Cited

U.S. PATENT DOCUMENTS

| | | | |
|---|---|---|---|
| 6,831,865 B2 | 12/2004 | Chang et al. | |
| 8,687,421 B2 | 4/2014 | Avila et al. | |
| 9,001,579 B2 | 4/2015 | Song et al. | |
| 9,053,765 B2 | 6/2015 | Fukano | |
| 9,123,389 B1* | 9/2015 | Park | G11C 11/406 |
| 2003/0085731 A1* | 5/2003 | Iwase | G01R 31/31701 326/16 |
| 2005/0195304 A1* | 9/2005 | Nitta | H03M 1/1023 348/308 |
| 2007/0183242 A1* | 8/2007 | Miyamoto | G11C 11/22 365/222 |
| 2012/0257453 A1* | 10/2012 | Shiino | G11C 16/26 365/185.18 |
| 2013/0135008 A1* | 5/2013 | Zhang | B82Y 10/00 326/41 |
| 2014/0269069 A1 | 9/2014 | D'Abreu et al. | |
| 2014/0346320 A1* | 11/2014 | Sohn | H04N 5/378 250/208.1 |
| 2016/0118129 A1 | 4/2016 | Muchherla et al. | |
| 2016/0203873 A1* | 7/2016 | Kuribara | G11C 16/26 365/185.24 |

\* cited by examiner

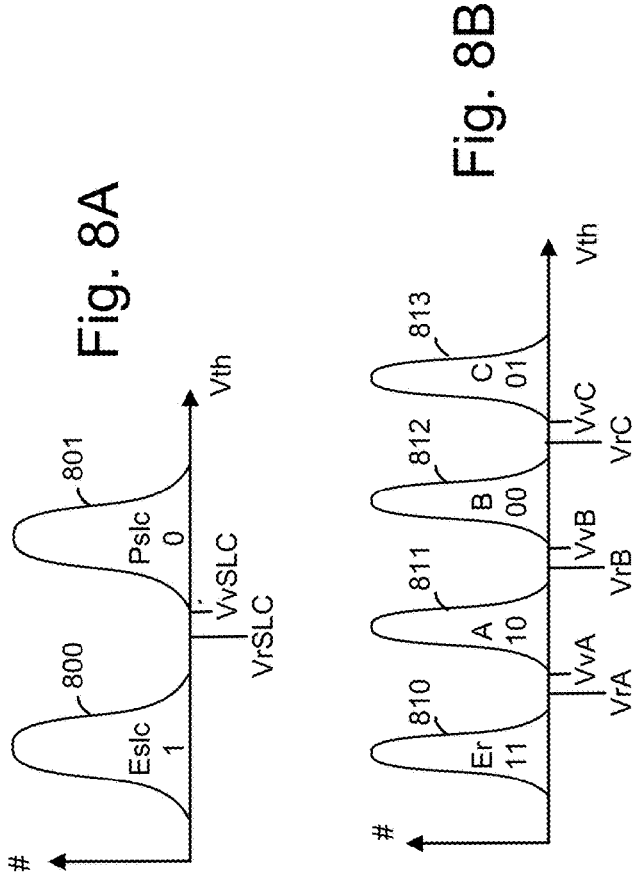
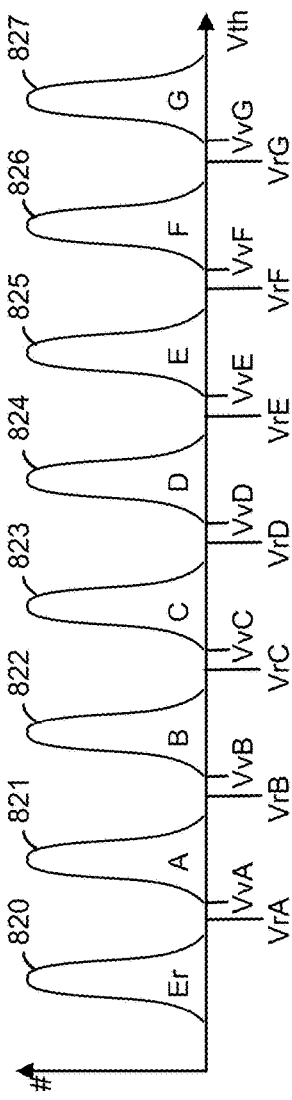
Fig. 8A
Fig. 8B
Fig. 8C
Fig. 8D

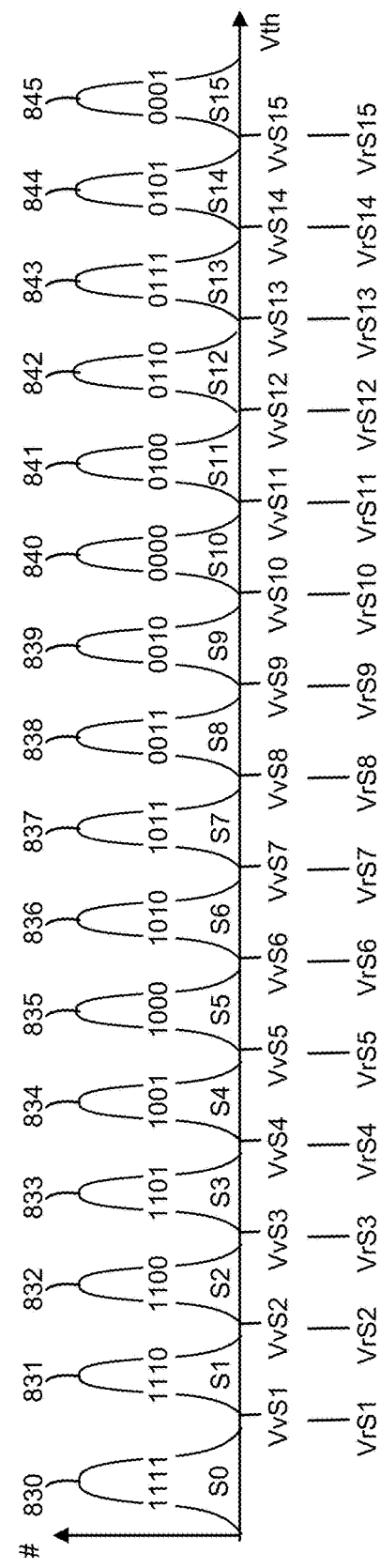

Fig. 10A

| Counter | | | Data state/Voltage shift | | | | | | | Set id |
|---|---|---|---|---|---|---|---|---|---|---|
| MSB | LSB | Time (min.) | A | B | C | D | E | F | G | |
| 0 | 0 | 0-19 | 0 | 0 | 0 | 0 | 0 | 0 | 0 | set0a |
| 0 | 1 | 20-39 | " | " | " | " | " | " | " | " |
| 1 | 0 | 40-59 | " | " | " | " | " | " | " | " |
| 1 | 1 | >=60 | -12c | -9c | -6c | -3c | 0 | 3c | 6c | set3a |

Fig. 10B

| Counter | | | Data state/Voltage shift | | | | | | | Set id |
|---|---|---|---|---|---|---|---|---|---|---|
| MSB | LSB | Time (min.) | A | B | C | D | E | F | G | |
| 0 | 0 | 0-19 | 0 | 0 | 0 | 0 | 0 | 0 | 0 | set0a |
| 0 | 1 | 20-39 | -4c | -3c | -2c | -1c | 0 | 1c | 2c | set1a |
| 1 | 0 | 40-59 | -8c | -6c | -4c | -2c | 0 | 2c | 4c | set2a |
| 1 | 1 | >=60 | -12c | -9c | -6c | -3c | 0 | 3c | 6c | set3a |

| Counter | | | Data state/Voltage shift | | | | | | | Set id |
|---|---|---|---|---|---|---|---|---|---|---|
| MSB | LSB | Time (min.) | A | B | C | D | E | F | G | |
| 0 | 0 | 0-6 | 0 | 0 | 0 | 0 | 0 | 0 | 0 | set0b |
| 0 | 1 | 7-13 | " | " | " | " | " | " | " | " |
| 1 | 0 | 14-20 | | | | | | | | |
| 1 | 1 | 21-27 | | | | | | | | |
| 0 | 0 | 28-34 | | | | | | | | |
| 0 | 1 | 35-41 | | | | | | | | |
| 1 | 0 | 42-48 | | | | | | | | |
| 1 | 1 | >=49 | -28c | -21c | -14c | -7c | 0 | 7c | 14c | set7b |

Fig. 10C

| Counter | | | Data state/Voltage shift | | | | | | | Set id |
|---|---|---|---|---|---|---|---|---|---|---|
| MSB | LSB | Time (min.) | A | B | C | D | E | F | G | |
| 0 | 0 | 0-6 | 0 | 0 | 0 | 0 | 0 | 0 | 0 | set0b |
| 0 | 1 | 7-13 | -4c | -3c | -2c | -1c | 0 | 1c | 2c | set1b |
| 1 | 0 | 14-20 | -8c | -6c | -4c | -2c | 0 | 2c | 4c | set2b |
| 1 | 1 | 21-27 | -12c | -9c | -6c | -3c | 0 | 3c | 6c | set3b |
| 0 | 0 | 28-34 | -16c | -12c | -8c | -4c | 0 | 4c | 8c | set4b |
| 0 | 1 | 35-41 | -20c | -15c | -10c | -5c | 0 | 5c | 10c | set5b |
| 1 | 0 | 42-48 | -24c | -18c | -12c | -6c | 0 | 6c | 12c | set6b |
| 1 | 1 | >=49 | -28c | -21c | -14c | -7c | 0 | 7c | 14c | set7b |

Fig. 10D

| Counter | | | Data state/Voltage shift | | | | | | | Set id |
|---|---|---|---|---|---|---|---|---|---|---|
| MSB | LSB | Time (min.) | A | B | C | D | E | F | G | |
| 0 | 0 | 0-6 | 0 | 0 | 0 | 0 | 0 | 0 | 0 | set0b |
| 0 | 1 | 7-20 | -4c | -3c | -2c | -1c | 0 | 1c | 2c | set1b |
| 1 | 0 | 14-20 | " | " | " | " | " | " | " | " |
| 1 | 1 | 21-27 | -12c | -9c | -6c | -3c | 0 | 3c | 6c | set3b |
| 0 | 0 | 28-34 | " | " | " | " | " | " | " | " |
| 0 | 1 | 35-41 | " | " | " | " | " | " | " | " |
| 1 | 0 | 42-48 | -24c | -18c | -12c | -6c | 0 | 6c | 12c | set6b |
| 1 | 1 | >=49 | " | " | " | " | " | " | " | " |

Fig. 10E

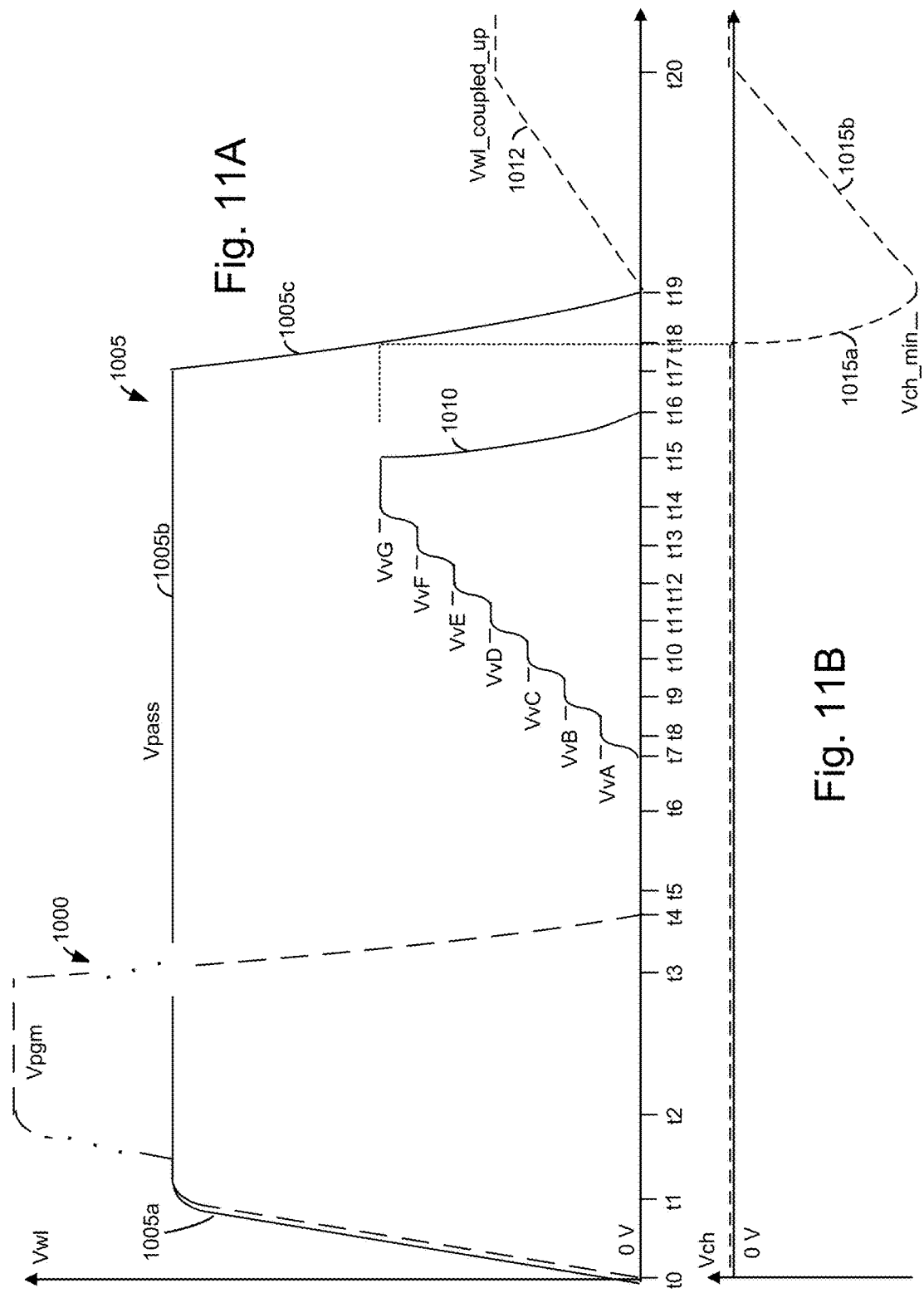

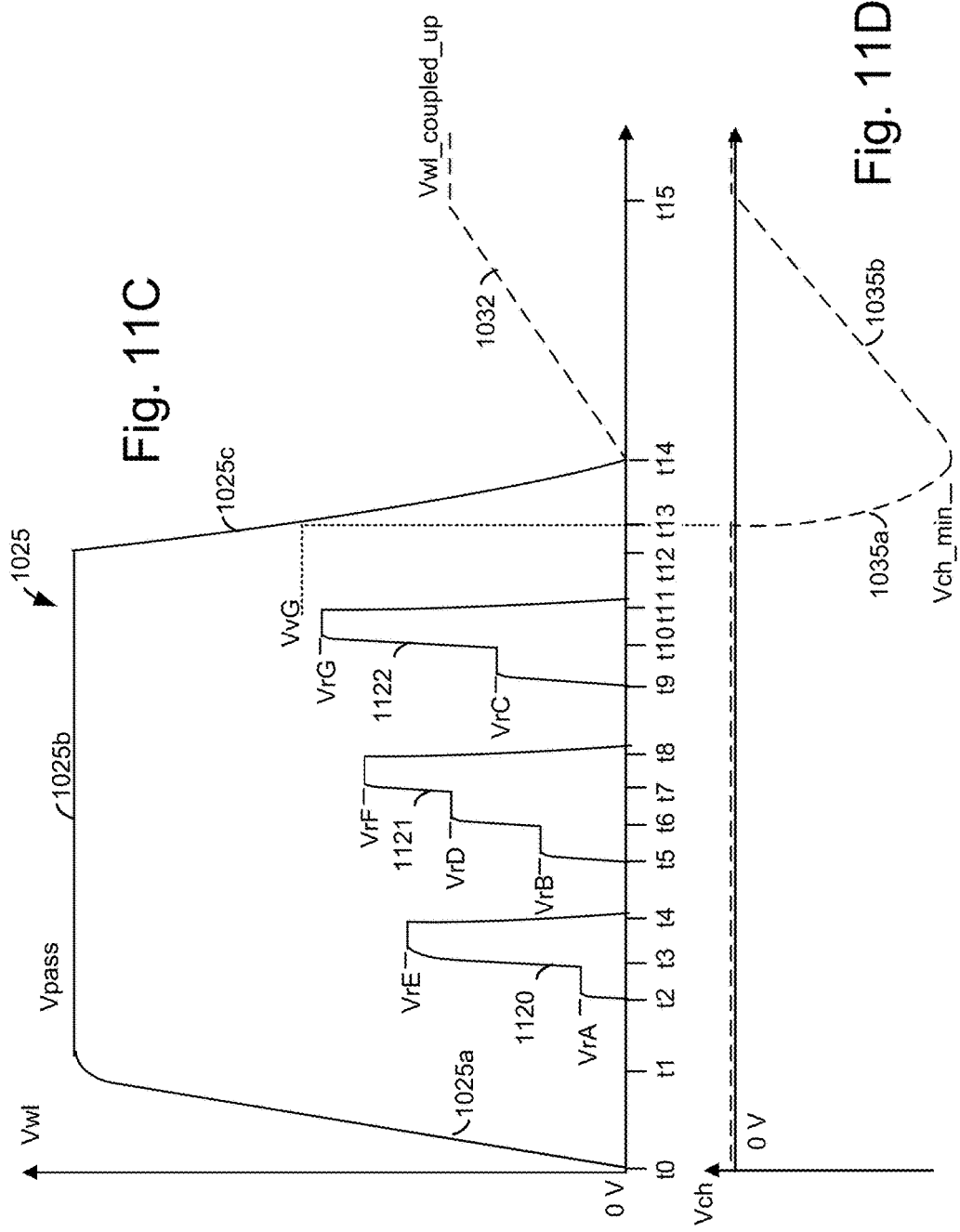

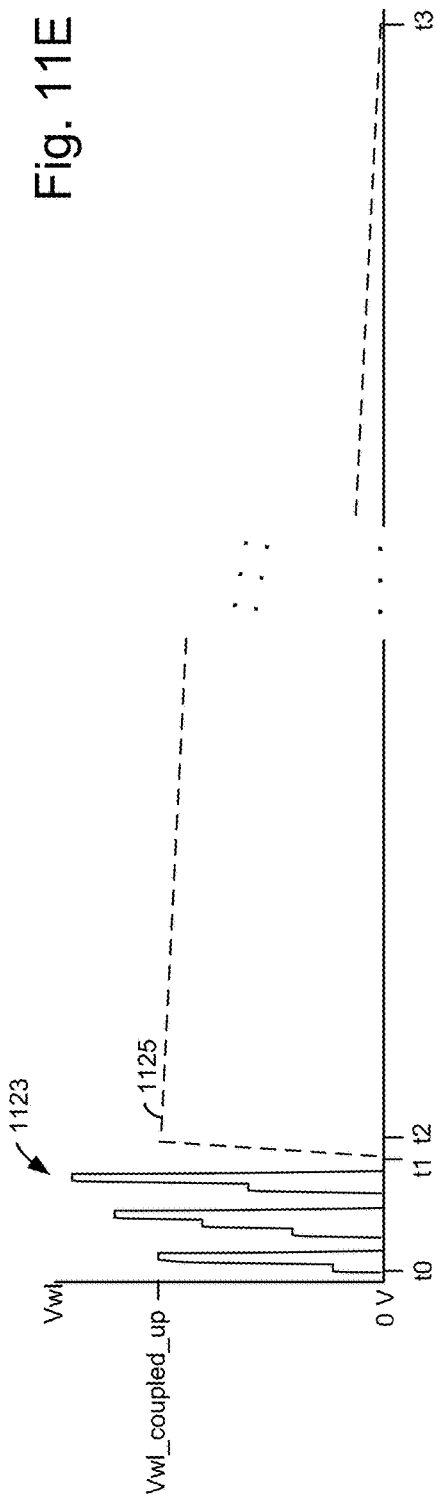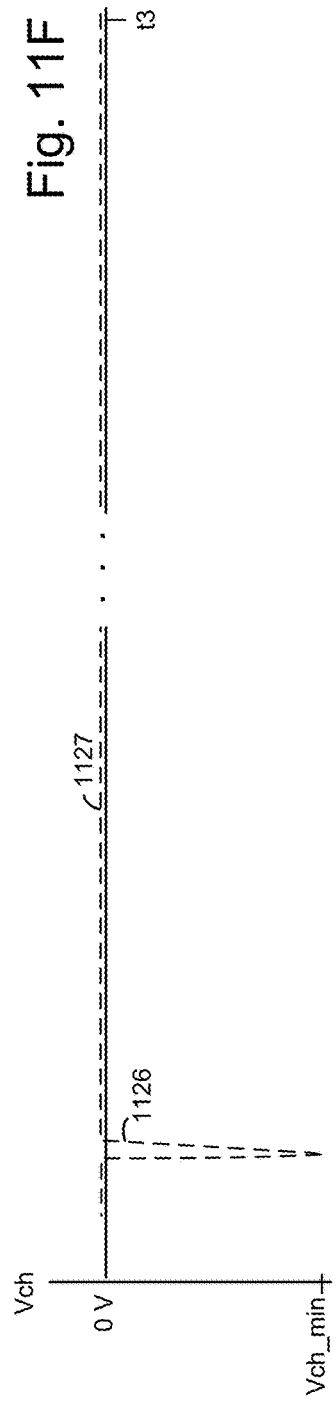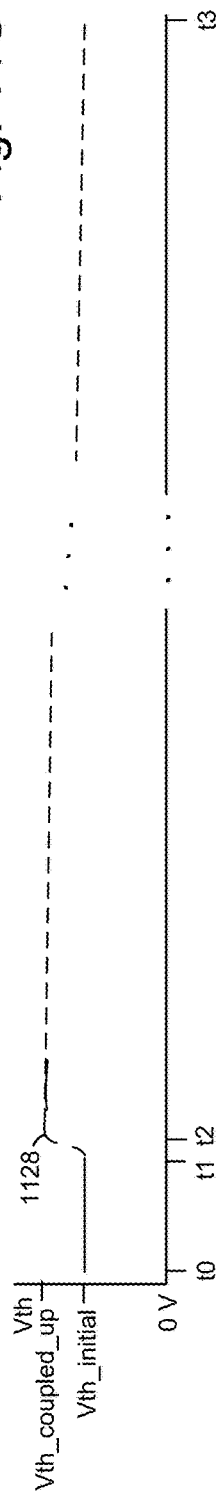

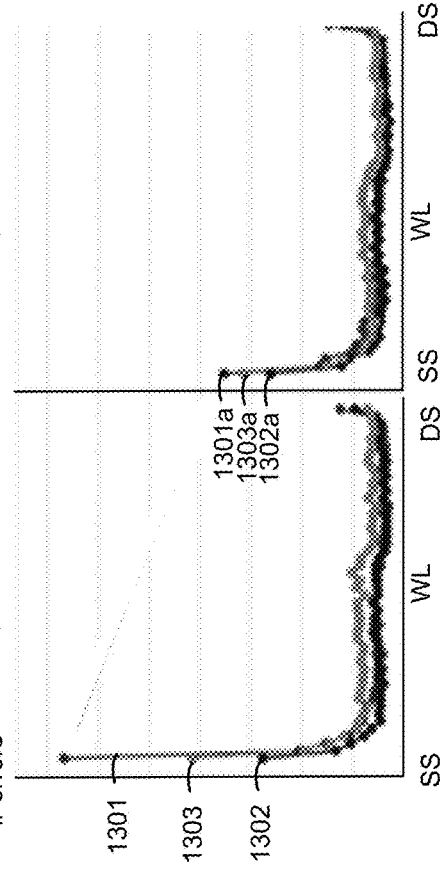
Fig. 13A
Fig. 13B
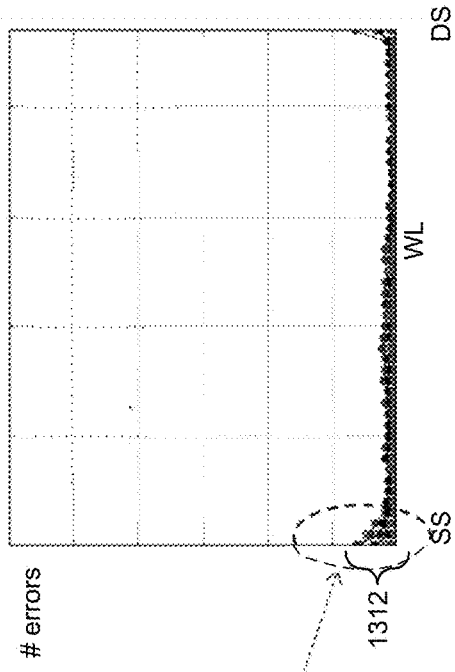
Fig. 13C
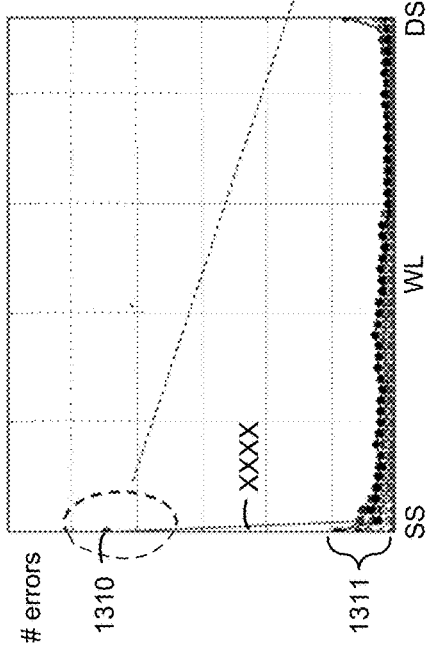
Fig. 13D

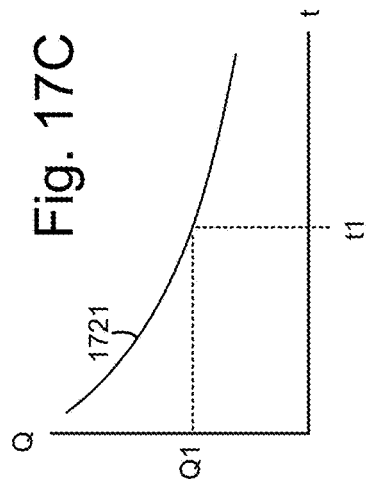
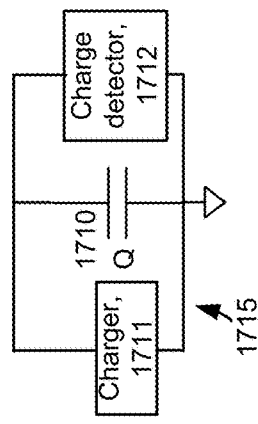
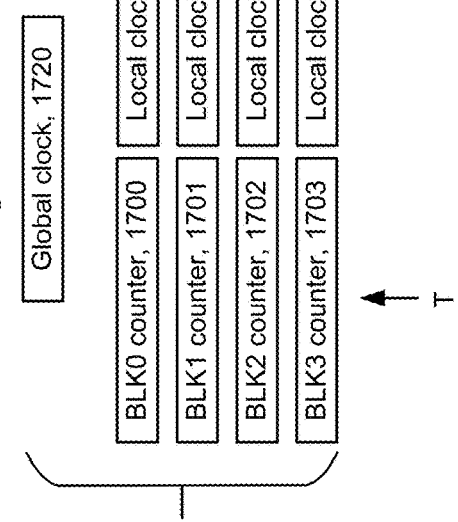
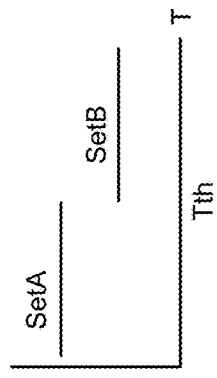
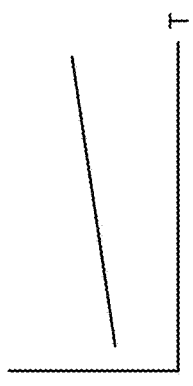
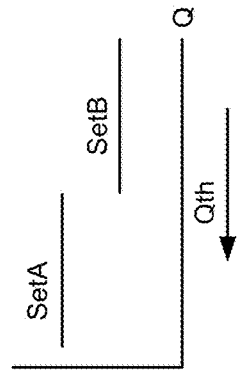

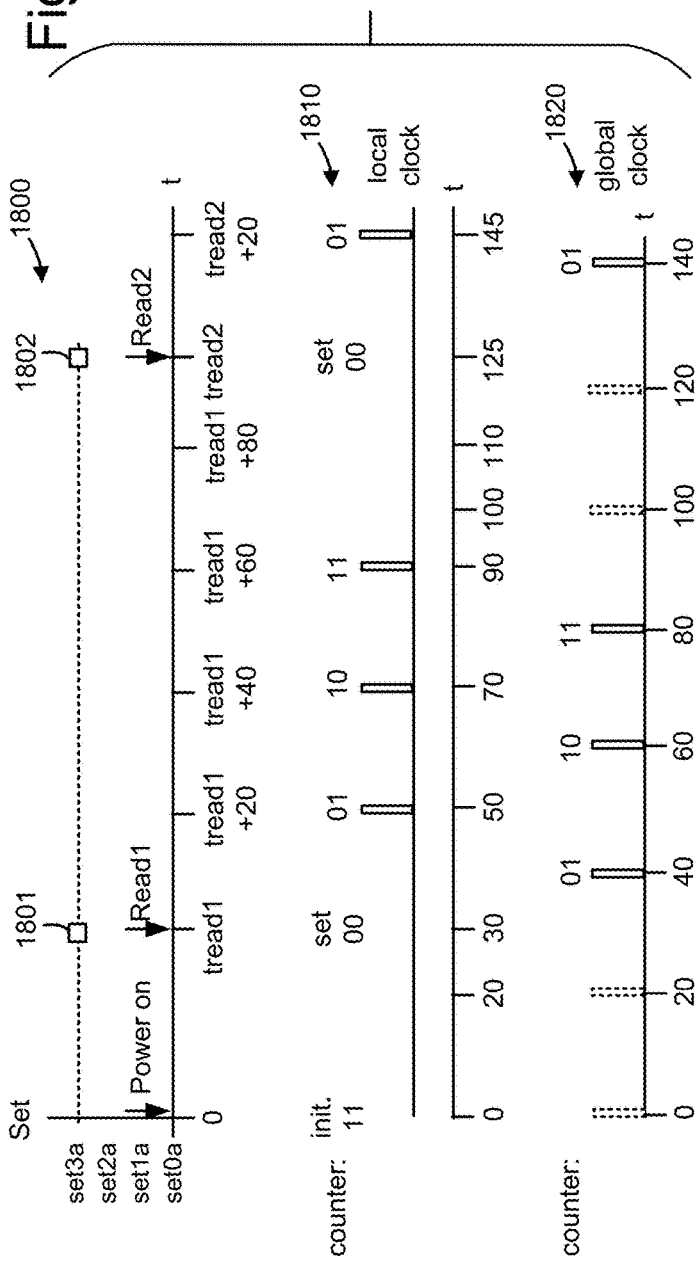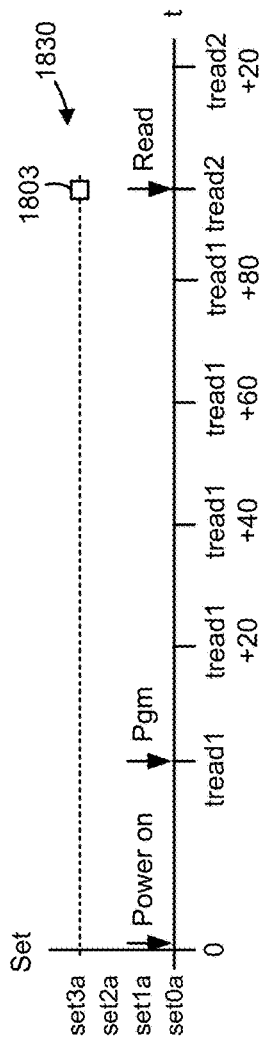

US 9,711,231 B1

SYSTEM SOLUTION FOR FIRST READ ISSUE USING TIME DEPENDENT READ VOLTAGES

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 8A depicts example Vth distributions of memory cells, where two data states are used.

FIG. 8B depicts example Vth distributions of memory cells, where four data states are used.

FIG. 8C depicts example Vth distributions of memory cells, where eight data states are used.

FIG. 8D depicts bit sequences for different data states and for lower, middle and upper pages of data, and associated read voltages.

FIG. 8G depicts example Vth distributions of memory cells, where sixteen data states are used.

FIG. 10A depicts an example table of read voltage shifts for use with a two-bit counter, where two sets of voltage shifts are provided.

FIG. 10B depicts an example table of read voltage shifts for use with a two-bit counter, where four sets of voltage shifts are provided.

FIG. 10C depicts an example table of read voltage shifts for use with a three-bit counter, where two sets of voltage shifts are provided.

FIG. 10D depicts an example table of read voltage shifts for use with a three-bit counter, where eight sets of voltage shifts are provided.

FIG. 10E depicts an example table of read voltage shifts for use with a three-bit counter, where four sets of voltage shifts are provided.

FIG. 11A depicts a plot of example waveforms in a programming operation.

FIG. 11B depicts a plot of a channel voltage (Vch) corresponding to FIG. 11A.

FIG. 11C depicts a plot of example waveforms in a read operation.

FIG. 11D depicts a plot of a channel voltage (Vch) corresponding to FIG. 11C.

FIG. 11E depicts the waveforms of FIG. 11C showing a decay of the coupled up voltage of the word line.

FIG. 11F depicts a plot of a channel voltage consistent with FIG. 11E.

FIG. 11G depicts a plot of a Vth of a memory cell connected to the coupled up word line, consistent with FIGS. 11E and 11F.

FIG. 13A depicts a plot of a total number of errors versus word line position for a first read situation, where the read voltages are not optimized.

FIG. 13B depicts a plot of a total number of errors versus word line position for a second read situation, where the read voltages are optimized.

FIG. 13C depicts a plot of a number of errors versus word line position for different types of failures, in a first read situation, where the read voltages are not optimized. FIG. 13D depicts a plot of a number of errors versus word line position for different types of failures, in a first read situation, where the read voltages are optimized.

FIG. 17A depicts a set of counters for tracking a time period since a last sensing operation for each of the blocks of FIG. 3.

FIG. 17B depicts an example capacitor circuit for tracking a time period since a last sensing operation for each of the blocks of FIG. 17A.

FIG. 17C depicts a plot of charge versus a time period since a last sensing operation for the capacitor of FIG. 17B.

FIG. 17D depicts a plot of data set versus decreasing capacitor charge level.

FIG. 17E depicts a plot of clock frequency (0 versus temperature (T).

FIG. 17F depicts a plot of data set versus temperature.

FIG. 18A1 depicts example time lines showing selection of sets of read voltage shifts as a function of a time period since a last sensing operation, for a two-bit counter consistent with FIG. 10A or 10B.

FIG. 18A2 depicts an example time line similar to FIG. 18A1 except a program operation occurs at tread1 instead of a read operation.

DETAILED DESCRIPTION

Figure 1A:
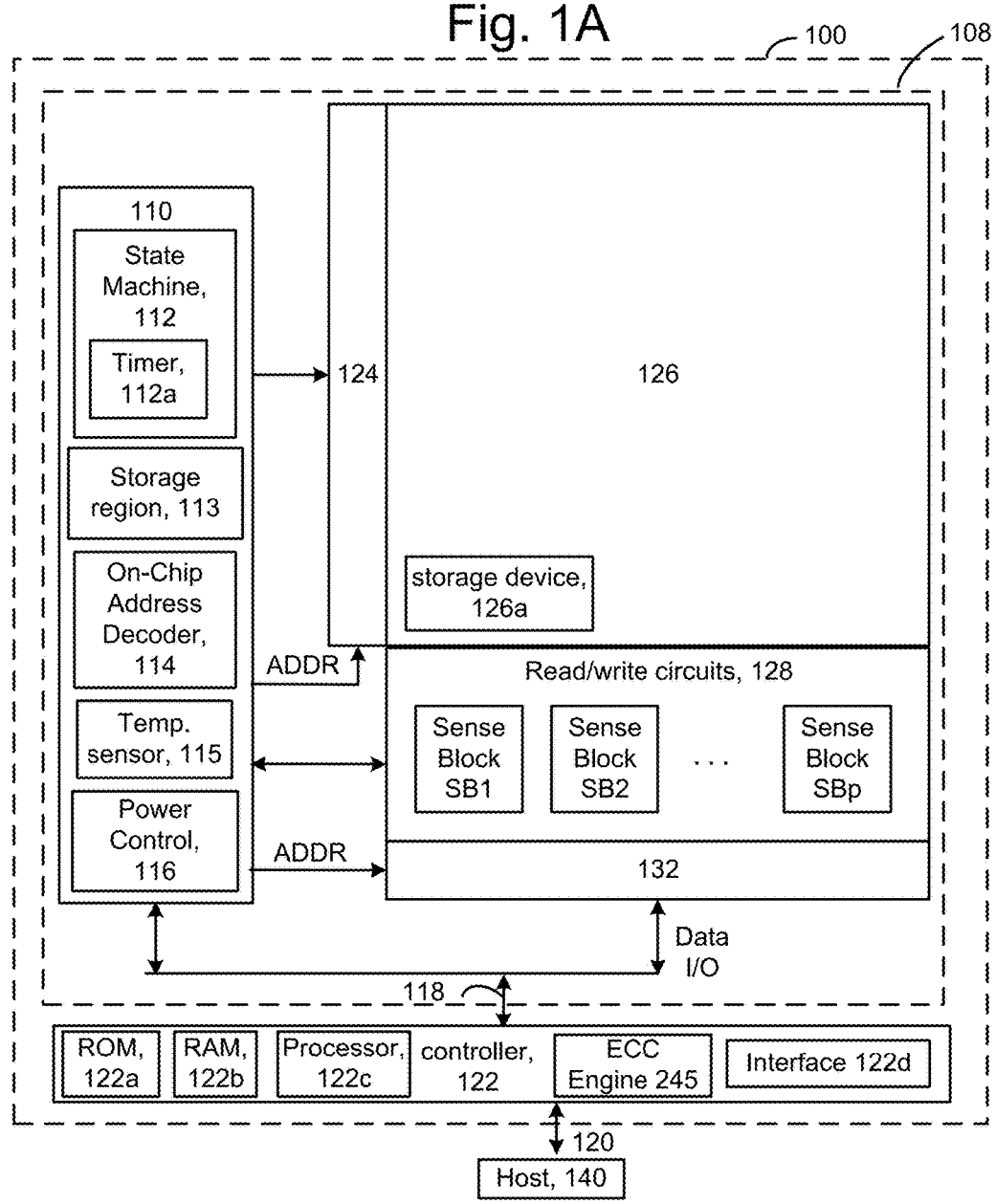
FIG. 1A is a block diagram of an example memory device.

Techniques are provided for improving the accuracy of read operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 8A). In a two-bit per cell memory device, there are four data states including the erased state and three higher data states referred to as the A, B and C data states (see FIG. 8B). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8G) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can vary depending on when the read operation occurs. For example, the Vth can vary in the memory cells depending on a coupled up state of the word lines when the read operation occurs. A "first read" can be defined in which the word lines are not coupled up, and a "second read" situation can be defined in which the word lines are coupled up.

The cells can be in the first read situation after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read situation after a significant amount of time, e.g., one hour, has passed after a last sensing operation, since the word line discharges over time. The coupling up of the word lines causes a Vth shift in the cells due to inadvertent programming or erasing. Since the word lines are not significantly coupled up while in the first read situation, there is little or no programming or erasing of the cells due to the word line voltage, so there is little or no shift in the Vth of the cells.

The cells can be in the second read situation, e.g., when the read occurs shortly, e.g., seconds or minutes, after a last sensing operation. Since the word lines are relatively strongly coupled up while in the second read situation, there is a programming or erasing of the cells due to the word line voltage, so there can be a significant shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there is weak erasing of cells which have a relatively high Vth, higher than the coupled-up voltage, e.g., cells in higher programmed data states, thus resulting in a Vth downshift for these cells.

The cells gradually transition from the second read situation to the first read situation over time, e.g., one hour, as the word lines are discharged.

The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read or verify voltage) to a selected word line. At the same time, a pass voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. The Vth gradually decreases as electrons which are trapped in the charge trapping material of the cells are de-trapped and return to the channel, e.g., over a period of time such as one or more hours. See FIG. 11A to 11G.

Since a programming operation includes sensing, a programming operation for one word line in a block results in the other word lines of the block entering the second read situation if they are not already in the second read situation.

The second read situation is more common than the first read situation since read operations frequently occur as the device is being used. Thus, the nominal read voltages are typically optimized for the second read situation. As a result, when the cells are read while in the first read situation, the Vth will be downshifted for the lower programmed states and upshifted for the higher programmed states. This can result in read errors. Moreover, the cells can be in an intermediate situation which is between the first and second situations.

Techniques provided herein address the above and other issues. In one aspect, read voltages are set and optimized based on the time period since a last sensing operation. A timing device such as an n-bit digital counter may be provided for each block. In one approach, the counter is set to all 1's when the device is powered on and is in the first read situation. When a sensing operation occurs, e.g., a program-verify operation or a read operation, the counter is periodically incremented based on a clock. When a subsequent read operation occurs, the value of the counter is obtained and used to read a table of read voltage shifts (offsets). These are shifts from a reference set of read voltages. When the time period since the last sensing is relatively small, the shifts are relatively small. When the time period since the last sensing is relatively large, the shifts are relatively large. The counter continues counting until it reaches a state which designates the second read situation.

In another approach, an analog time keeping device is provided such as by monitoring the discharge of a capacitor.

In one approach, each block has its own counter so that the read voltages are optimized to the block based on the amount of word line coupling up in the block. A clock which triggers the counting of the counter may be local to the block, or, for efficiency, a global clock may be used for the counters of all blocks, or some set of multiple blocks.

The read voltage shifts can be optimized for different groups of cells and word lines in a block. For example, in a 3D stacked memory device, cells near the top of the stack may have a smaller amount of word line coupling up due to a wider memory hole diameter at the top of the stack. The read voltage shifts can therefore be smaller than for cells near the bottom of the stack where the memory hole diameter is narrower.

Various other features and benefits are described below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The state machine may include a clock 112a to determine an elapsed time since a last sensing operation, as discussed further below. A storage region 113 may be provided, e.g., for read voltage shifts, as described further below. Generally, the storage region may store operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 24. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

The controller 122 may also include a temperature-sensing circuit 115 which is used by the processor 122c to set temperature-based parameters. For example, the controller may provide a digital signal to the power control module 116 to adjust a counter or to select a set of read voltages. See also FIG. 1C.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
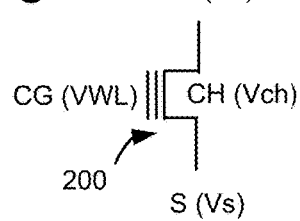
FIG. 1B depicts an example memory cell 200.

FIG. 1B depicts an example memory cell 200. The memory cell comprises a control gate CG which receives a word line voltage Vwl, a drain at a voltage Vd, a source at a voltage Vs and a channel at a voltage Vch.

Figure 1C:
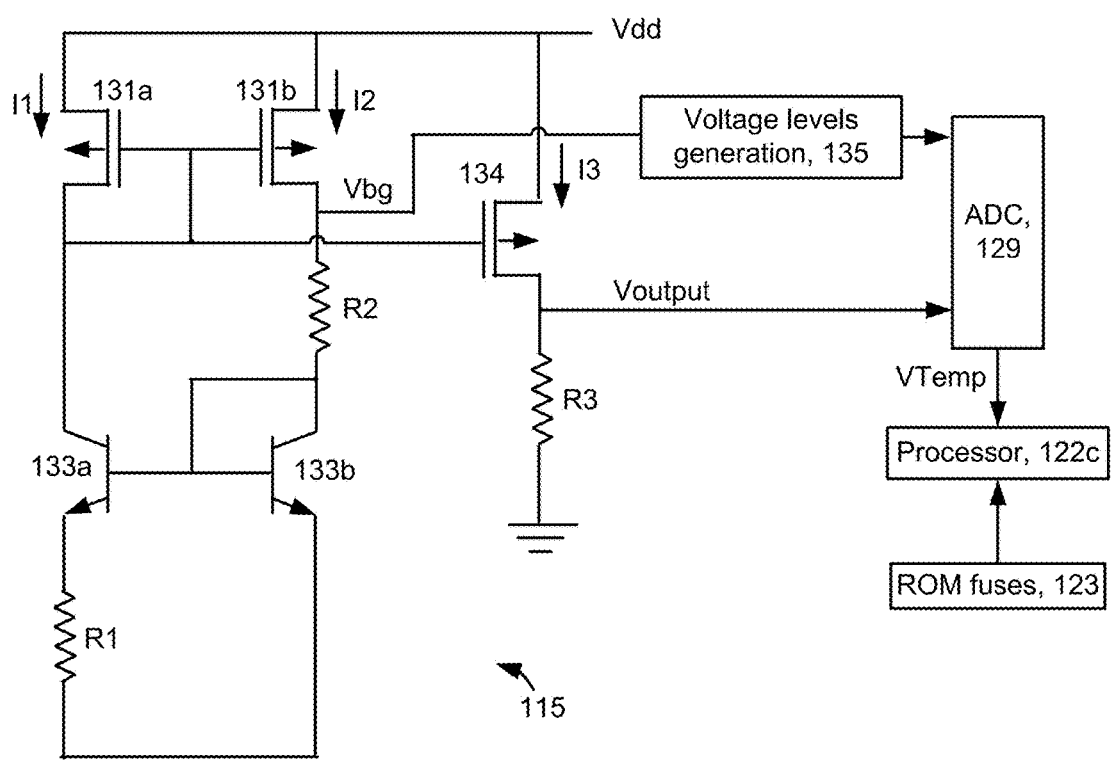
FIG. 1C depicts an example of the temperature-sensing circuit 115 of FIG. 1B.

FIG. 1C depicts an example of the temperature-sensing circuit 115 of FIG. 1A. The circuit includes pMOSFETs 131$a$, 131$b$ and 134, bipolar transistors 133$a$ and 133$b$ and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131$b$ and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
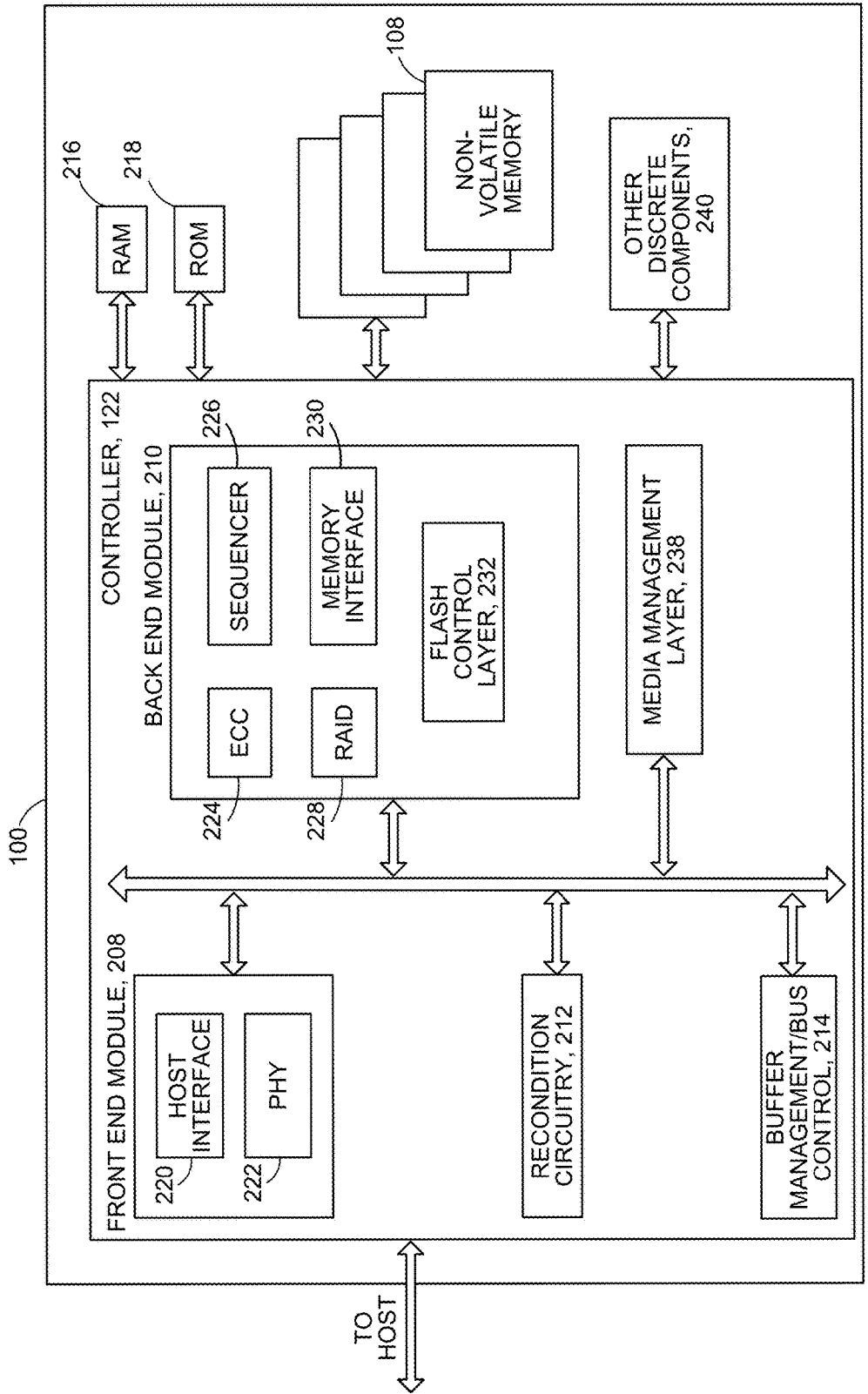
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface, such as Toggle Mode 200, 400, or 800 megatransfers/sec. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224.

Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. In one embodiment, memory interface 230 may be a double data rate (DDR) interface, such as a Toggle Mode 200, 400, or 800 interface. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
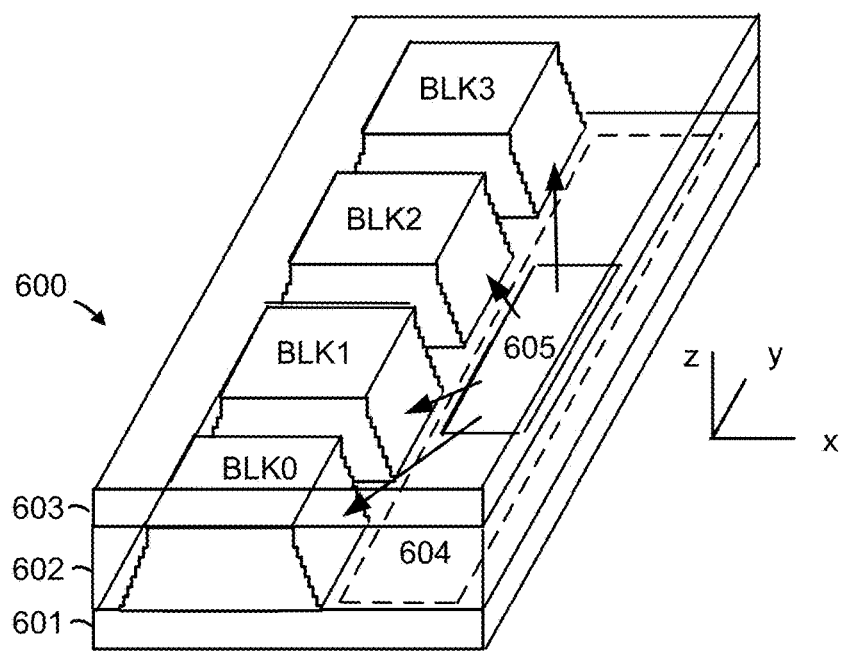
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
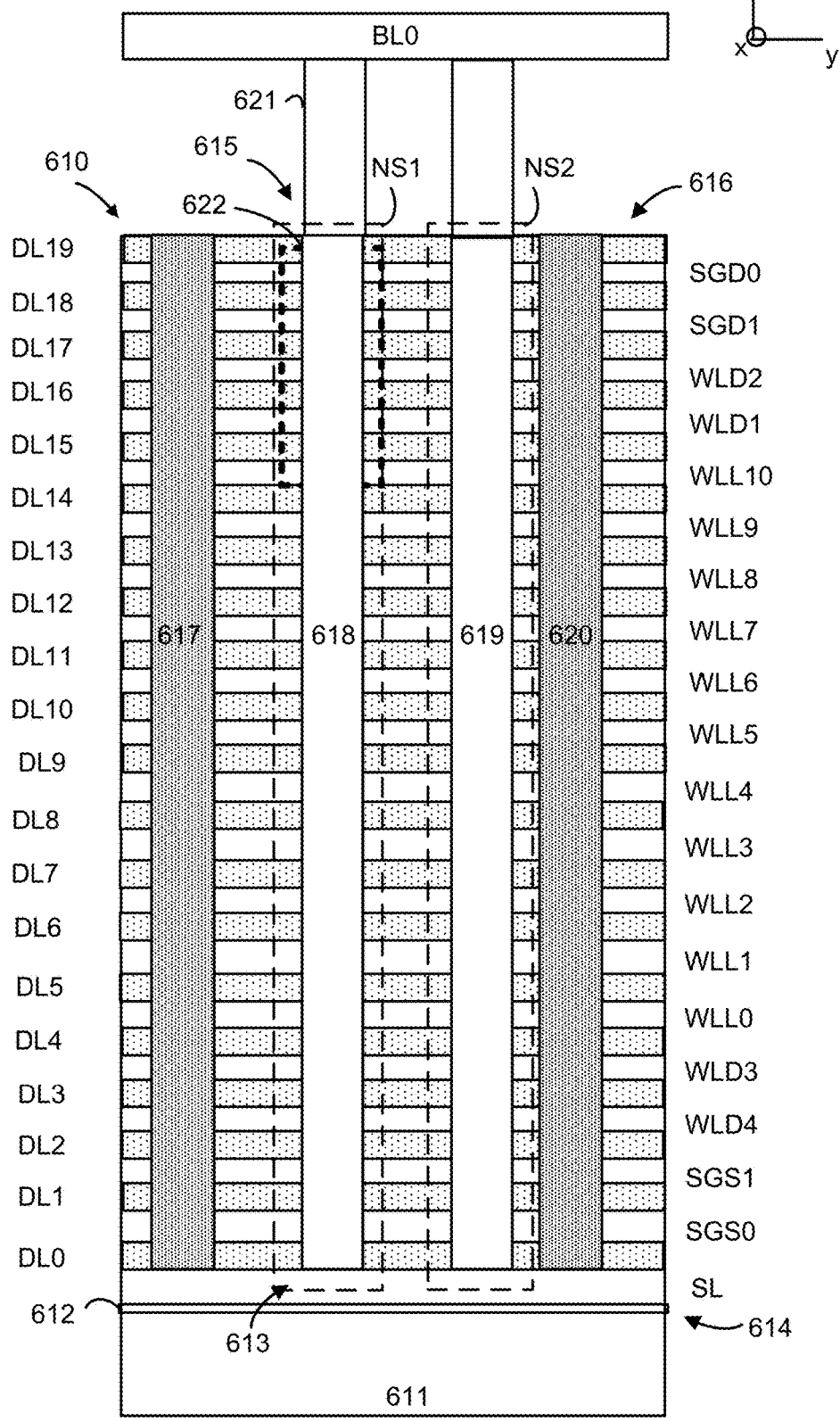
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
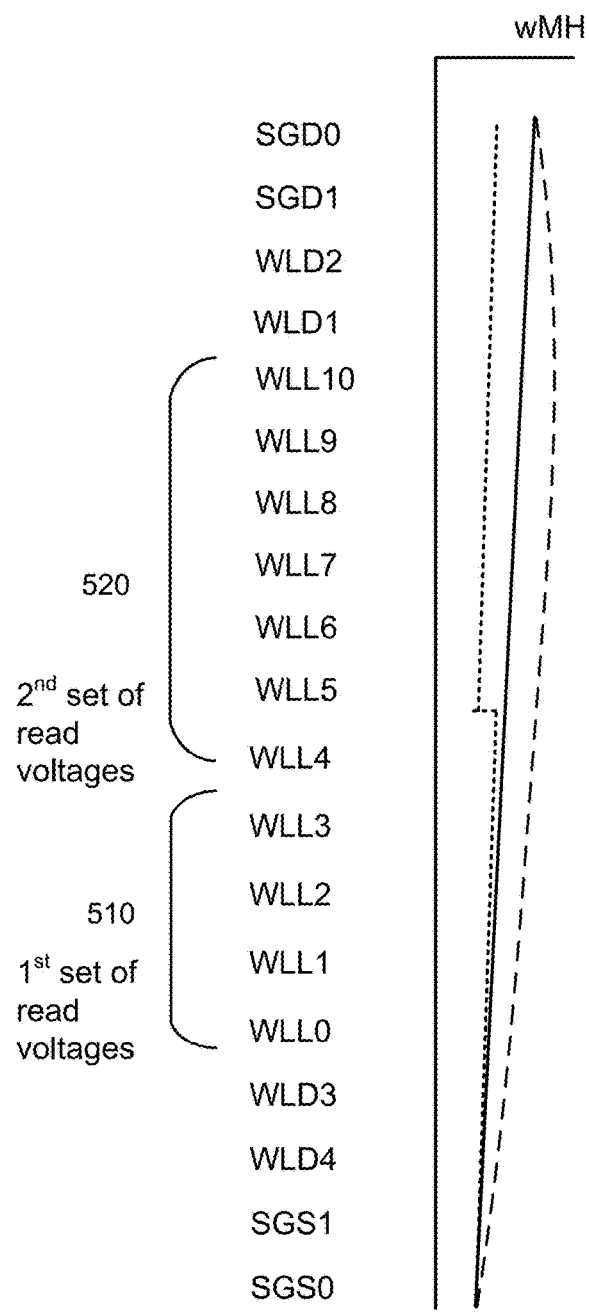
FIG. 5 depicts a plot of memory hole diameter in the stack of FIG. 4.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter at the bottom of a memory hole, the electric field across the tunnel oxide is relatively stronger, so that the programming and erase speed is higher. The amount of word line coupling up and discharge is therefore relatively larger, so that the optimum read voltage shifts will be relatively larger, for each programmed data state. This is compared to read voltage shifts for cells which are adjacent to the relatively larger diameter at the top of the memory hole.

The read voltage shifts described herein can be optimized for different groups of cells and word lines according to the memory hole diameter which is a function of the height in the stack. For example, a first group 510 of word lines WLL0-WLL3 includes adjacent word lines at a bottom of the stack and a second group 520 of word lines WLL4-WLL10 includes adjacent word lines at a top of the stack. Each group can have its own table of read voltage shifts or read voltages. The second group is above the first group, adjacent to a wider portion of the memory hole. The groups can have the same or a different number of word lines.

In one approach, a block of memory cells comprises a stack of alternating control gate and dielectric layers, including one group of control gate layers (e.g., WLL0-WLL3) below another group of control gate layers (e.g., WLL4-WLL10); the memory cells are arranged in vertically extending memory holes in the stack; the memory holes have a width which increases with a height in the stack; and the different sets of read voltage shifts comprise one group of sets of read voltage shifts for the one group of control gate layers and another group of sets of read voltage shifts for the another group of control gate layers.

In another option, the read voltage shifts are set based on a number of program-erase (PE) cycles in a block. As the number of PE cycles increases, the programming and erase speed becomes higher. The amount of word line coupling up and discharge is therefore relatively larger, so that the optimum read voltage shifts will be relatively larger, for each programmed data state. Thus, the magnitude of the read voltage shifts can be relatively larger when the number of PE cycles is relatively higher. The magnitude of the read voltage shifts can be proportional to the number of PE cycles.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
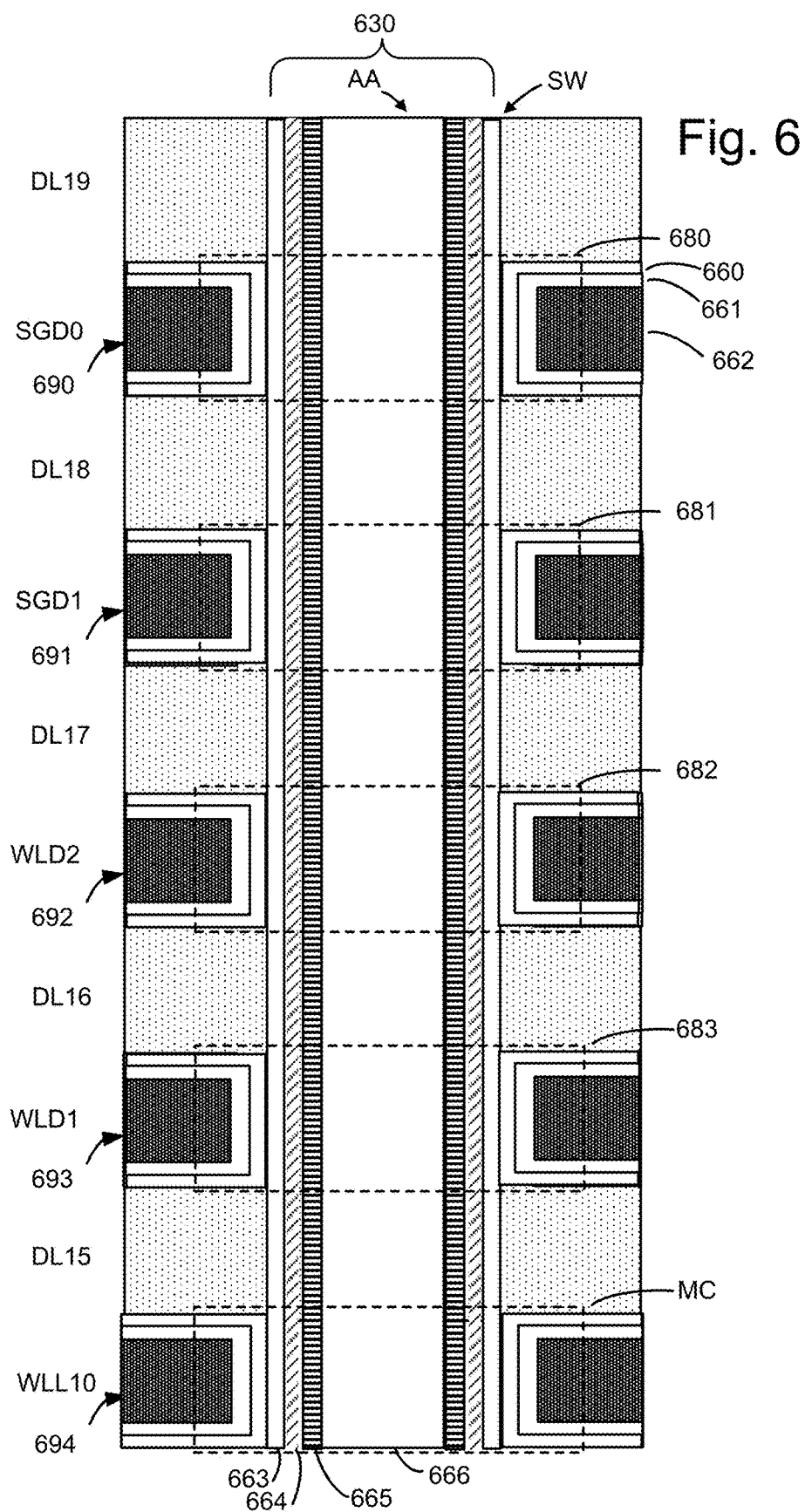
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
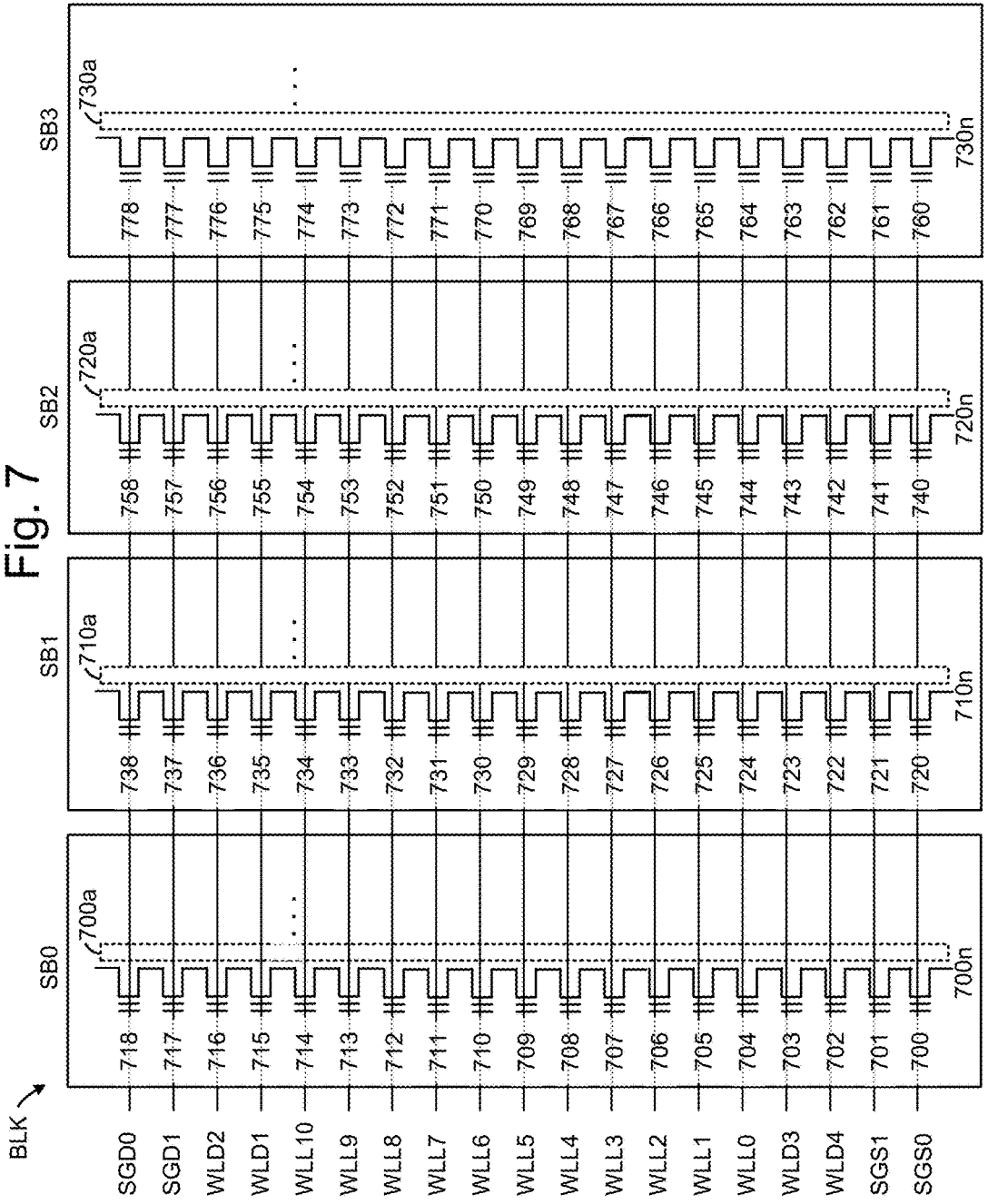
FIG. 7 depicts an example view of NAND strings in sub-blocks in a 3D configuration which is consistent with FIG. 4.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 4. In a block BLK, each sub-block comprises a set of NAND strings which extend in the x direction and which have a common SGD line. The NAND strings 700*n*, 710*n*, 720*n* and 730*n* are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700*n*, 710*n*, 720*n* and 730*n* have channel regions 700*a*, 710*a*, 720*a* and 730*a*, respectively.

Additionally, NAND string 700*n* includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710*n* includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720*n* includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730*n* includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

FIG. 8A depicts example Vth distributions of memory cells, where two data states are used. During a programming operation, the final Vth distribution can be achieved by using one or more programming passes. Each pass may use incremental step pulse programming, for instance. See FIG. 25. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

The Vth distributions 800 and 801 represent an erased state (Eslc) and a programmed data state (Pslc), respectively. Further, assume in this example that the cells have remained in the second read situation since the programming has completed so that the Vth distributions have not been shifted.

The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the upper tail of the Vth distribution of the lower state and the lower tail of the Vth distribution of the higher state.

FIG. 8B depicts example Vth distributions of memory cells, where four data states are used. The data states are represented by Vth distributions 810, 811, 812 and 813 for the Er (erased), A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

FIG. 8C depicts example Vth distributions of memory cells, where eight data states are used. For the Er, A, B, C, D, E, F and G states, we have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

FIG. 8D depicts bit sequences for different data states and for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG. See also FIG. 17C2, which describes read errors for different pages of data.

Figure 8E:
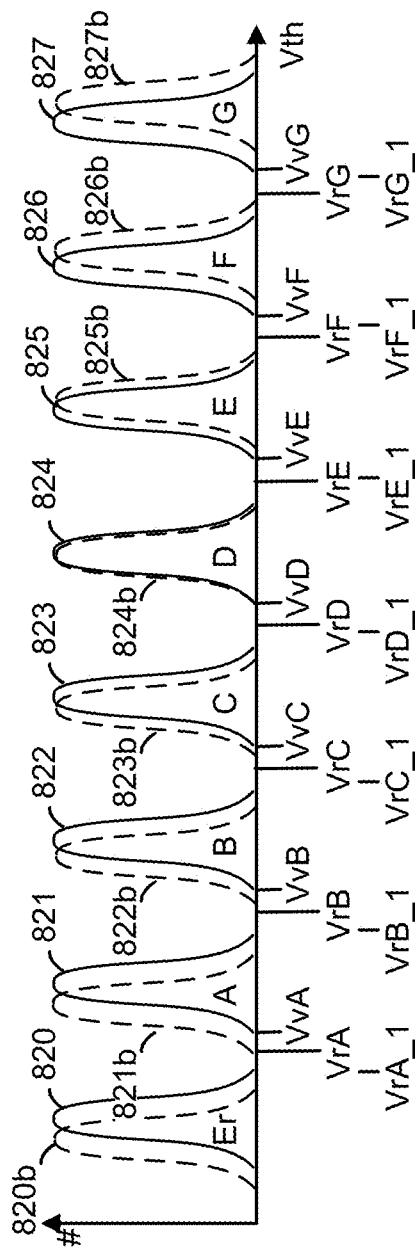
FIG. 8E depicts example Vth distributions of memory cells, where eight data states are used, and the Vth is lower for memory cells with lower data states and higher for memory cells with higher data states, where the shifts in Vth are relatively large.

FIG. 8E depicts example Vth distributions of memory cells, where eight data states are used, and the Vth is lower for memory cells with lower data states and higher for memory cells with higher data states, where the shifts in Vth are relatively large. As mentioned at the outset, the first read situation results in a Vth downshift for lower programmed data states and a Vth upshift for higher programmed data states.

For the Er, A, B, C, D, E, F and G states, we have Vth distributions 820, 821, 822, 823, 824, 825, 826 and 827, respectively, as in FIG. 8C, in the second read situation. For the first read situation, the Vth distributions 820*b*, 821*b*, 822*b*, 823*b* and 824*b* of the Er, A, B, C and D states, respectively, represent progressively larger Vth downshifts for the progressively lower programmed data states. The Vth distributions 825*b*, 826*b* and 827*b* of the E, F and G states, respectively, represent progressively larger Vth upshifts for the progressively higher programmed data states. For the first read situation, the read voltages can be adjusted so that they are optimal based on the amount of Vth shift. In particular, VrA, VrB, VrC and VrD are downshifted to VrA_1, VrB_1, VrC_1 and VrD_1, respectively, and VrE, VrF and VrG are upshifted to VrE_1, VrF_1 and VrG_1, respectively. Optionally, the read voltages of one or more midrange data states are not adjusted for the first read situation. For example, VrD may be used in both the first and second read situations. The suffix "_1" denotes the first read situation. A set of read voltage shifts can be stored in a table such as in FIG. 10A to 11C to provide the optimized read voltages.

Figure 8F:
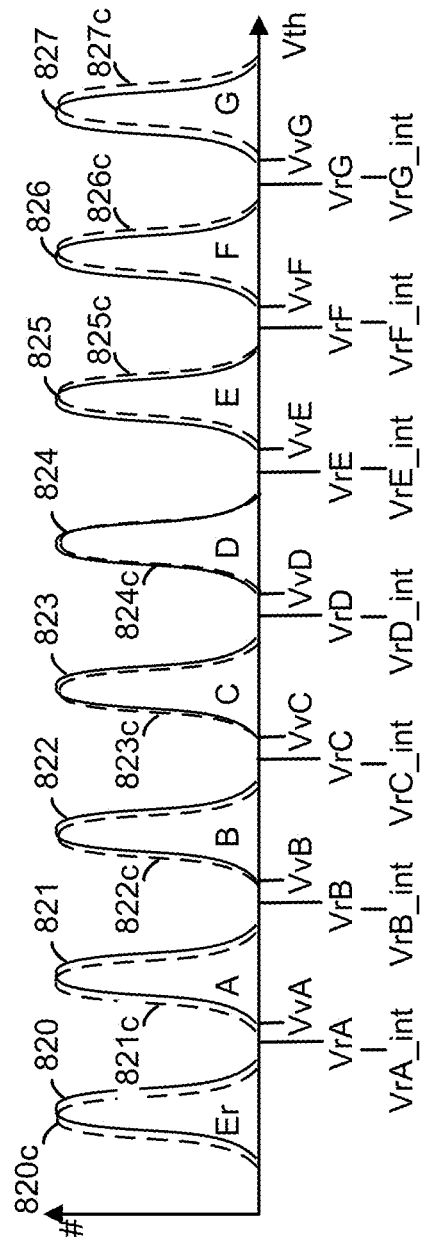
FIG. 8F depicts example Vth distributions of memory cells, where eight data states are used, and the Vth is lower for memory cells with lower data states and higher for memory cells with higher data states, where the shifts in Vth are relatively small.

FIG. 8F depicts example Vth distributions of memory cells, where eight data states are used, and the Vth is lower for memory cells with lower data states and higher for memory cells with higher data states, where the shifts in Vth are relatively small. For the Er, A, B, C, D, E, F and G states, we again have Vth distributions 820, 821, 822, 823, 824, 825, 826 and 827, respectively, as in FIG. 8C, in the second read situation. An intermediate read situation occurs between the first and second read situations. In the intermediate read situation, there is an intermediate amount of word line coupling up. This is between the first read situation in which the word lines are essentially discharged and the second read situation in which the word lines are coupled up by a maximum amount.

For the intermediate read situation, the Vth distributions 820*c*, 821*c*, 822*c*, 823*c* and 824*c* of the Er, A, B, C and D states, respectively, represent progressively larger Vth downshifts for the progressively lower programmed data states. The Vth distributions 825*c*, 826*c* and 827*c* of the E, F and G states, respectively, represent progressively larger Vth upshifts for the progressively higher programmed data states. For the intermediate read situation, the read voltages are adjusted so that they are optimal. In particular, VrA, VrB, VrC and VrD are downshifted to VrA_int, VrB_int, VrC_int and VrD_int, respectively, and VrE, VrF and VrG are upshifted to VrE_int, VrF_int and VrG_int, respectively. Optionally, the read voltages of one or more midrange data states are not adjusted for the intermediate read situation. For example, VrD may not be adjusted.

FIG. 8G depicts example Vth distributions of memory cells, where sixteen data states are used. Programming using four bits per cell (16 levels) can involve lower, lower-middle, upper-middle and upper pages. The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15. The read voltages can be adjusted for a first read situation as discussed for the eight-state case.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

Figure 9A:
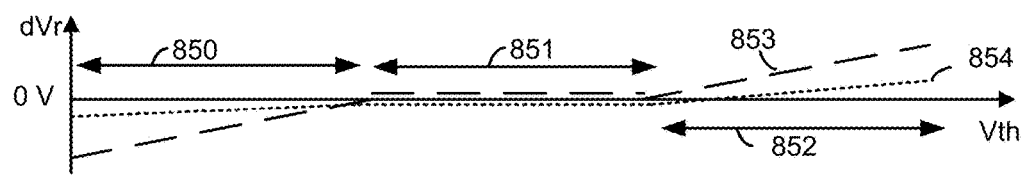
FIG. 9A depicts a plot of a shift in read voltage versus Vth, showing relatively large and small shifts consistent with FIGS. 8E and 8F, respectively.

FIG. 9A depicts a plot of a shift in read voltage versus Vth, showing relatively large and small shifts consistent with FIGS. 8E and 8F, respectively. As mentioned, in a first read situation (plot 853) or intermediate situation (plot 854), a Vth downshift may be seen for one or more lower states represented by a Vth range 850, essentially no change in Vth may be seen in one or more midrange states represented by a Vth range 851, and a Vth upshift may be seen for one or more upper states represented by a Vth range 852. These shifts are relative to Vth levels in the second read situation.

Figure 9B:
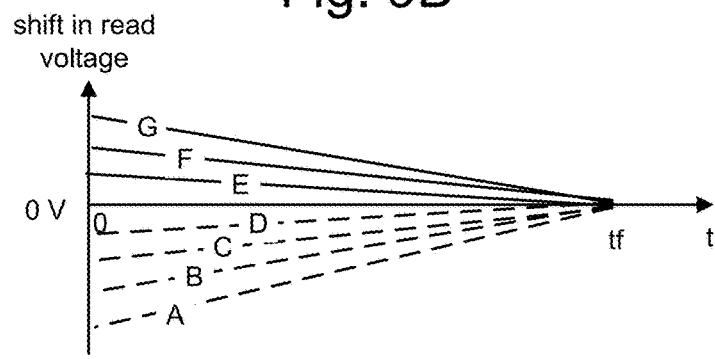
FIG. 9B depicts a plot of shift in the read voltages of different data states versus time since a last sensing operation, where the shift becomes smaller with time according to a linear function.

FIG. 9B depicts a plot of shift in the read voltages of different data states versus time since a last sensing operation, where the shift becomes smaller with time according to a linear function. The time t=0 represents the time of a sensing operation while the cells are in the first read situation. The shift in read voltage is largest in magnitude at this time since the word lines are discharged and the Vth of the cells is relatively far from the Vth of the second situation for each programmed data state. The shift decreases gradually in magnitude as time progresses from 0 to tf. At tf, a shift of 0 V may be used, in one approach. By tracking the time, an optimal set of read voltages can be selected to provide an accurate read operation with minimal read errors. Separate plots are provided for the programmed states labelled as A, B, C, D, E, F and G, where the plots for A, B, C, D show a downshift and the plots for E, F and G show an upshift.

Figure 9C:
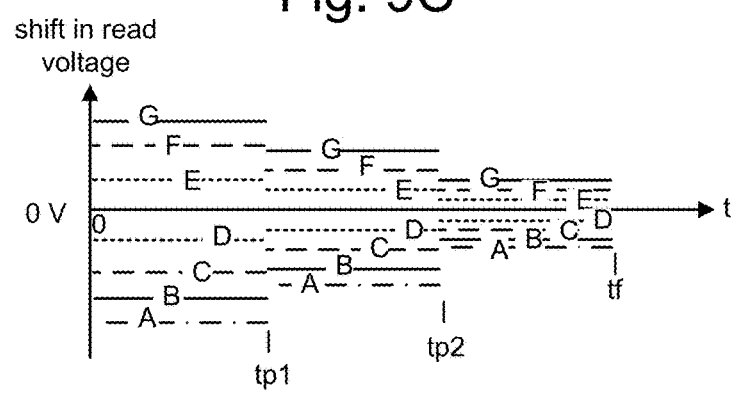
FIG. 9C depicts a plot of shift in the read voltages of different data states versus time since a last sensing operation, where the shift becomes smaller with time according to a staircase function.

FIG. 9C depicts a plot of shift in the read voltages of different data states versus time since a last sensing operation, where the shift becomes smaller with time according to a staircase function. In this example, a time period of tf is divided into three subperiods: 0 up to tp1, tp1 up to tp2 and tp2 up to tf. The magnitude of the shift is fixed in each subperiod, but decreases progressively with time. The user of a staircase function with two or more steps is suitable for use with a digital counter in which the time since a last sensing operation is marked in discrete increments. Separate plots are provided for the programmed states labelled as A, B, C, D, E, F and G, where the plots for A, B, C, D show a downshift and the plots for E, F and G show an upshift.

FIG. 10A depicts an example table of read voltage shifts for use with a two-bit counter, where two sets of voltage shifts are provided. As mentioned, when a sensing operation occurs, a counter can begin counting time. When a subsequent read operation occurs, the value of the counter is obtained and used to read a table of read voltage shifts. This provides optimum read voltages. With a two-bit counter, four values are possible. The table depicts a most significant bit (MSB), a least significant bit (LSB), a set of data states and an associated set of voltage shifts, and an identifier of the set.

The read voltage shifts depicted show relative values and not absolute values, where c is a constant. For each programmed data state, a read voltage is obtained from a read voltage shift by adding the read voltage shift to a reference read voltage. The reference read voltages can be the same or different than the read voltages for the second read situation. Note that a table could alternatively be provided which directly lists the read voltage, but the use of the shift can be more efficient. This approach allows the reference read voltages to be stored within the memory die while the shifts are stored in a memory of the controller, of the die.

A first value such as 11 can represent the first read situation. When a sensing operation occurs in the first read situation, the read voltages are obtained using set3a and the counter begins counting. The counter is set to 00 immediately after the read operation. If no read operation occurs in a time of 0-19 minutes after the last sensing operation, for example, the counter is set to 01. If no read operation occurs in a time of 20-39 minutes after the last sensing operation, for example, the counter is set to 10. If no read operation occurs in a time of 40-59 minutes after the last sensing operation, for example, the counter is set to 10. Finally, if no read operation occurs in a time of 60+ minutes after the last sensing operation, for example, the counter is set to 11 again, indicating that the cells have returned to the first read situation.

In this example, for simplicity, the same set of shifts, e.g., of 0 V, (set0a), are used for the counter values of 00, 01 and 10. These values indicate the cells are in the second read situation, as a simplification. The shifts in set0a are smaller than in set3a.

If a read operation occurs before the counter transitions from 00 to 11, the shifts of set0a are selected for the read operation. Moreover, in FIGS. 10A and 10B, the counter is reset to 00 each time a read operation occurs.

In one approach, an apparatus comprises a storage device (e.g., RAM) comprising a counter for a block of memory cells, wherein different values of the counter identify different sets of read voltage shifts (e.g., set0a, set3a) for the block. A controller is configured to: in response to a power on event involving the block, set the counter to a first value (e.g., 11) which is cross-referenced to a largest set of read voltage shifts (e.g., set3a) from among the different sets of read voltage shifts; and in response to a sensing operation in the block, set the counter to a second value (e.g., 00) which is cross-referenced to a smallest set of read voltage shifts (e.g., set0a) from among the different sets of read voltage, and periodically increment the counter.

The memory cells of a block are programmed to different programmed data states (e.g., A, B, C, D, E, F and G) comprising a lowest programmed data state (A) and a highest programmed data state (G); and a largest set of read voltage shifts (e.g., set3a) comprise a negative read voltage shift (e.g., −12c) for the lowest programmed data state and a positive read voltage shift (e.g., 6c) for the highest programmed data state.

In one approach, the controller is configured to increment the counter to one or more intermediate values (e.g., 01 and 10) which are between the first value and the second value, each of the one or more intermediate values is cross-referenced to the smallest set of read voltage shifts (e.g., set0a); and in response to a read command received while the counter has the one or more intermediate values, the controller is configured to cause a read operation involving the block using the smallest set of read voltage shifts.

FIG. 10B depicts an example table of read voltage shifts for use with a two-bit counter, where four sets of voltage shifts are provided. The table differs from FIG. 10A in that the shifts are different for each value of the counter. This allows the read voltages to be more closely tailored to the coupled up state of the cells. The first, second, third and fourth largest shifts are provided in set3a, set2a, set1a and set0a, respectively.

As before, a first value such as 11 can represent the first read situation. When a sensing operation occurs in the first read situation, the read voltages are obtained using set3a and the counter begins counting. The counter is set to 00 immediately after the read operation, and transitions back to 11 if no subsequent read operation occurs in 60 minutes, for example. If a read operation occurs when the counter is at 00, 01 or 10, the shifts of set0a, set1a and set2a, respectively are selected for the read operation. The counter value of 00 can be considered to represent the second read situation. The counter values of 01 and 10 can be considered to represent intermediate read situations.

In one approach, a controller is configured to increment the counter to an intermediate value (e.g., 01 and 10) which is between the first value and the second value, the intermediate value is cross-referenced to an intermediate set of read voltage shifts (e.g., set1a, set2a) from among the different sets of read voltage shifts.

A magnitude of a largest read voltage shift (e.g., −8c) in the intermediate set of read voltage shifts is smaller than a magnitude of a largest read voltage shift (e.g., −12c) in the largest set of read voltage shifts and larger than a magnitude of a largest read voltage shift (e.g., 0.) in the smallest set of read voltage shifts.

In response to a read command received while the counter has the intermediate value, the controller may be configured to cause a read operation involving the block using the intermediate set of read voltage shifts.

In response to a read command received while the counter has the first value (e.g., 11), the controller is configured to cause a read operation involving the block using the largest set of read voltage shifts (e.g., set3a).

In response to a read command received while the counter has the second value (e.g., 00), the controller is configured to cause a read operation involving the block using the smallest set of read voltage shifts (e.g., set0a).

FIG. 10C depicts an example table of read voltage shifts for use with a three-bit counter, where two sets of voltage shifts are provided. By using additional bits in the counter, additional counter values can be defined, e.g., eight in this example. The time since the last sensing operation can be tracked with a finer resolution. The read voltage shifts depicted in FIG. 10C to 10E show relative values and not absolute value, where c is a constant (c can be different than in FIGS. 10A and 10B).

A first value such as 111 can represent the first read situation. When a sensing operation occurs in the first read situation, the read voltages are obtained using set7b and the counter begins counting. The counter is set to 000 immediately after the read operation. If no read operation occurs in a time of 0-6, 7-13, 14-20, 21-27, 28-34, 35-41 or 42-48 minutes after the last sensing operation, for example, the counter is set to 001, 010, 011, 100, 101 and 110, respectively. Finally, if no read operation occurs in a time of 60+ minutes after the last sensing operation, for example, the counter is set to 111 again, indicating that the cells have returned to the first read situation. In FIG. 10C to 10E, the counter is reset to 000 each time a read operation occurs.

In this example, for simplicity, the same set of shifts, e.g., of 0 V, (set0b), are used for the counter values of 000, 001, 010, 011, 100, 101 and 110. These values indicate the cells are in the second read situation, as a simplification. The shifts in set0b are smaller than in set7b. Thus, if a read operation occurs before the counter transitions from 000 to 111, the shifts of set0b are selected for the read operation. The table of FIG. 10C achieves a same result as the table of FIG. 10A but allows for a future increase in resolution, and may be desired because of the higher counter frequency.

FIG. 10D depicts an example table of read voltage shifts for use with a three-bit counter, where eight sets of voltage shifts are provided. The table differs from FIG. 10C in that the shifts are different for each value of the counter. This allows the read voltages to be more closely tailored to the coupled up state of the cells. The first, second, third, fourth, fifth, sixth, seventh and eighth largest shifts are provided in set7b, set 6b, set5b, set4b, set3b, set2b, set1b and set0b, respectively.

As before, a first value such as 111 can represent the first read situation. When a sensing operation occurs in the first read situation, the read voltages are obtained using set7b and the counter begins counting. The counter is set to 000 immediately after the read operation, and transitions back to 111 if no subsequent read operation occurs in 60 minutes, for example. If a read operation occurs when the counter is at 000, 001, 010, 011, 100, 101 or 110, the shifts of set0b, set1b, set2b, set3b, set4b, set5b and set6b, respectively are selected for the read operation. The counter value of 000 can be considered to represent the second read situation. The counter values of 001, 010, 011, 100, 101 and 110 can be considered to represent intermediate read situations.

FIG. 10E depicts an example table of read voltage shifts for use with a three-bit counter, where four sets of voltage shifts are provided. The number of voltage shifts is greater than in FIG. 10C but less than in FIG. 10D. This approach allows multiple counter values to be cross-referenced to one set of read voltage shifts. Further, assuming the counter is incremented at a fixed frequency, different time periods since a last read operation can be cross-referenced to the different sets of read voltages. For example, time periods of 0-6, 7-20, 21-41 and 42-60, with durations of 6, 13, 20 and 18 minutes, respectively, can be cross-referenced to set0b, set1b, set3b and set6b, respectively. This allows a closer tailoring of the shifts to the word line discharge behavior. The first, second, third and fourth largest shifts are provided in set6b, set3b, set1b and set0b, respectively.

As before, a first value such as 111 can represent the first read situation. When a sensing operation occurs in the first read situation, the read voltages are obtained using set6b and the counter begins counting. The counter is set to 000 immediately after the read operation, and transitions back to 111 if no subsequent read operation occurs in 60 minutes, for example.

If a read operation occurs when the counter is at 000, the shifts of set0b are selected. If a read operation occurs when the counter is at 001 or 010, the shifts of set1b are selected. If a read operation occurs when the counter is at 011, 100 or 101, the shifts of set3b are selected. If a read operation occurs when the counter is at 110, the shifts of set6b are selected.

The counter value of 000 can be considered to represent the second read situation. The counter values of 001, 010, 011, 100, 101 and 110 can be considered to represent intermediate read situations.

FIG. 11A depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. A pass voltage 1005 is applied to the unselected word lines from t5-t19 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. The program voltage can temporarily pause at an intermediate level such as Vpass to avoid a single large transition which can have undesired coupling effects. Optionally, the pass voltage may be increased sooner so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The waveform decreases from VvG to 0 V or other steady state level from t15-t16.

For the unselected word lines, the decrease in Vpass will cause the cells to transition from a conductive state to a non-conductive state. In particular, when the Vpass falls below the Vth of a cell, the channel of the cell will become cutoff, e.g., the cell will become non-conductive. The dotted line at t18 indicates when a cell with Vth=VvG becomes non-conductive. When a cell becomes non-conductive, it acts as a capacitor in which the control gate is one plate and the channel is another plate. As the pass voltage 1005 decreases from VvG to 0 V, the channel is capacitively coupled down by a similar amount, as represented by a dashed line 1015a in FIG. 11B.

The plot 1012 is shown increasing relatively quickly but this is not to scale. In practice, the read operation, e.g., from t5-t19, may consume about 100 microseconds, while the coupling up of the word line may be significantly longer, in the millisecond range such as 10 milliseconds.

FIG. 11B depicts a plot of a channel voltage (Vch) corresponding to FIG. 11A. The channel is capacitively coupled down to a minimum level of Vch_min from t18-t19 and then begins to return to its original, starting level of, e.g., 0 V from t19-t20. The voltages of the word lines are allowed to float starting at t19, so that the voltages (plot 1012) are capacitively coupled higher by the increase in Vch (plot 1015b). The voltages of the word lines float to a peak level of Vwl_coupled_up. For example, VvG may be 5 V, so that there is a 5 V change in the word line voltage, e.g., 5-0 V, which is coupled to the channel. Vch_min may be about −5 V in this example. There is a 5 V increase in Vch which is coupled to the word line, e.g., control gate, of the cells. Vwl_coupled_up may be about 4 V.

FIG. 10C depicts a plot of example waveforms in a read operation. A read operation is similar to a verify operation as both are sensing operations and both provide a coupling up of the word lines. The horizontal axis depicts time and the vertical axis depicts word line voltage, Vwl. A pass voltage 1025 is applied to the unselected word lines from t0-t14 and reaches a magnitude of Vpass. The pass voltage includes an increasing portion 1025a, a portion 1025b at Vpass and a decreasing portion 1025c. A read voltage includes a separate waveform 1120, 1121 and 1122 for each of the lower, middle and upper pages, respectively, consistent with FIG. 8D. The read voltages are applied to the selected word line. An eight-level memory device is used in this example. Read voltages of VrA and VrE are applied from t2-t4, read voltages of VrB, VrD and VrF are applied from t5-t8, and read voltages of VrC and VrG are applied from t9-t11. The waveform decreases from VrG to 0 V at t11.

For the unselected word lines, the decrease in Vpass will cause the cells to transition from a conductive state to a non-conductive state, as discussed. The dotted line at t13 indicates when a cell with Vth=VvG becomes non-conductive. As the pass voltage 1025 decreases from VvG to 0 V, the channel is capacitively coupled down by a similar amount, as represented by a dashed line 1035a in FIG. 11D.

FIG. 11D depicts a plot of a channel voltage (Vch) corresponding to FIG. 11C. The channel is capacitively coupled down to a minimum level of Vch_min from t13-t14 and then begins to return to its original, starting level of, e.g., 0 V from t14-t15. The voltages of the word lines are allowed to float starting at t14, so that the voltages (plot 1032) are capacitively coupled higher by the increase in Vch (plot 1035b). The voltages of the word lines float to a peak level of Vwl_coupled_up, as discussed.

FIG. 11E depicts the waveforms of FIG. 11C showing a decay of the coupled up voltage of the word line. The time scale is different than in FIG. 11A-11D and represents a longer time period such as one hour. The plot 1123 depicts the read voltages in a time period t0-t1. A plot 1125 depicts an increase in Vwl to a coupled up level (Vwl_coupled_up) due to coupling (in a time period t1-t2) followed by a decay of Vwl in a time period t2-t3. Generally, the increase in Vwl occurs relatively quickly compared to the time period of the decay.

FIG. 11F depicts a plot of a channel voltage consistent with FIG. 11E. A decrease to Vch_min followed by an increase (plot 1126) occurs in the time period t1-t2. Vch is about 0 V from t2-t3 (plot 1127).

FIG. 11G depicts a plot of a Vth of a memory cell connected to the coupled up word line, consistent with FIGS. 11E and 11F. For a cell in an example data state, such as the A state, the Vth is at an initial level, Vth_initial, from t0-t1. Vth increases from t1-t2 (plot 1128) due to coupling at the same time as the increase in Vch, to a peak level of Vth_coupled_up. The Vth then gradually decreases back to Vth_initial from t1-t3.

Figure 12A:
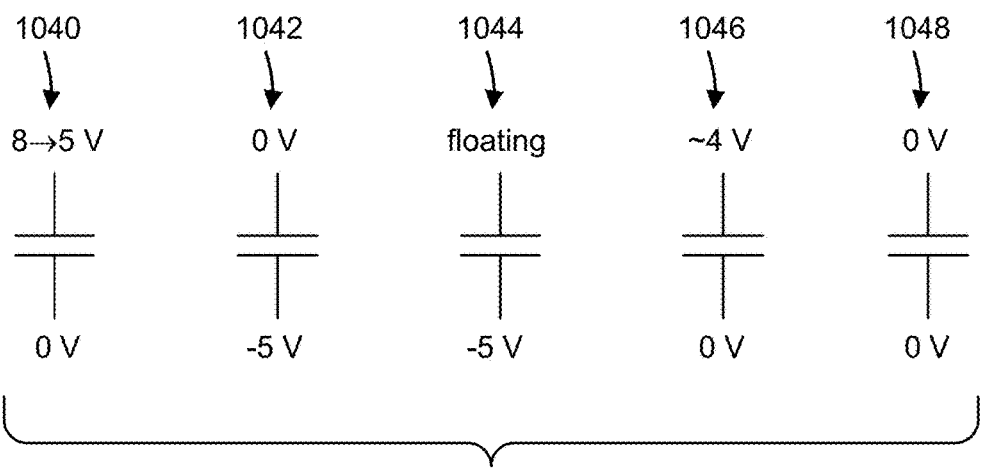
FIG. 12A depicts control gate and channel voltages on a memory cell which acts as a capacitor when the control gate voltage is decreased in a sensing operation.

FIG. 12A depicts control gate and channel voltages on a memory cell which acts as a capacitor when the control gate voltage is decreased in a sensing operation. As mentioned, the top plate represents the control gate or word line and the bottom plate represents the channel. The capacitor 1040 represents a memory cell in the time period of t17-t18 in FIG. 11A or t12-t13 in FIG. 11C, where Vpass=8 V and VvG=5 V. The word line voltage transitions from 8 to 5 V and Vch=0 V. The capacitor 1042 represents a memory cell at t19 in FIG. 11B or t14 in FIG. 11C. Vwl=0 V and Vch=−5 V. The capacitor 1044 represents a memory cell just after t19 in FIG. 11A or just after t14 in FIG. 11C. Vwl floats and Vch=−5 V. The capacitor 1046 represents a memory cell after t20 in FIG. 11A or after t15 in FIG. 11C. Vwl=4 V and Vch=0 V. Here, the word line is in a maximum coupled up state. If the Vth of the memory cell is less than 4 V, the memory cell will be weakly programmed so that its Vth increases. If the Vth of the memory cell is more than 4 V, the memory cell will be weakly erased so that its Vth decreases. The capacitor 1048 represents a memory cell after a significant amount of time has passed, e.g., an hour or more. Vwl=0 V and Vch=0 V. See t3 in FIG. 11E.

When a data word line voltage floats, the amount of holes needed to charge up the channel is relatively small. As a result, the selected word line can be relatively quickly coupled up to about 4 V, for example. The potential on the selected word line remains at ~4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read situation will occur again, resulting in an elevated number of read errors if a corrective action is not taken, such as periodically applying a dummy voltage which simulates the word line coupling up effects of a sensing operation, and/or adjusting the read voltages.

Figure 12B:
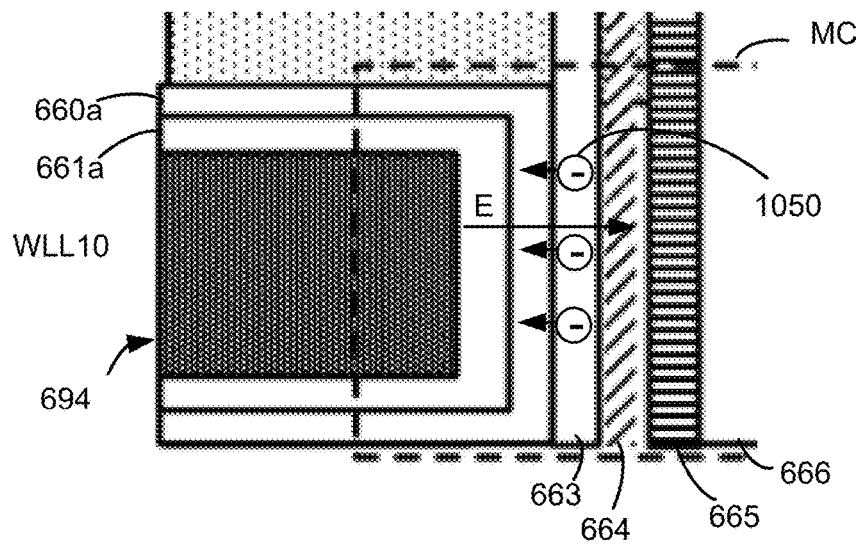
FIG. 12B depicts a portion of the memory cell MC of FIG. 6 showing electron injection into a charge trapping region during weak programming.

FIG. 12B depicts a portion of the memory cell MC of FIG. 6 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps. A weak erasing similarly involves an electric field which repels electrons from the charge trapping layer, decreasing the Vth.

FIG. 13A depicts a plot of a total number of errors versus word line position for a first read situation, where the read voltages are not optimized. The word line position ranges from the source side (SS), e.g., WL0, which could be at the bottom of a stack, to the drain side (DS), e.g., WLn, which could be at the top of the stack. Plots 1301, 1302 and 1303 depict the number of errors for the lower, middle and upper page reads, respectively. The error count is highest for the source side word lines, in this example, and for the lower page.

Generally, in a 3D stacked memory device, the first read of a page can result in a high fail bit count which results in a decode failure, if the reference read voltages are used. The number of errors is too high to be corrected by ECC decoding. Upon immediately reading any page on the same block, the second read has much lower fail bit count, as depicted in FIG. 13B. The issue occurs with a 3D stacked memory device because the channel is not directly connected to the substrate and can therefore float, resulting in Vth shifts of the memory cells, as mentioned above. Further, error recover techniques such as re-reads may be successful but further extend the read time. Moreover, the problem reappears after a power down/up of the memory device. The power up can be from an off state, a sleep state or other reduced power state. The first read state exists generally when the word lines are discharged, such as when 0 V or other low voltage is applied to them.

FIG. 13B depicts a plot of a total number of errors versus word line position for a second read situation, where the read voltages are optimized. Plots 1301a, 1302a and 1303a depicts the number of errors for the lower, middle and upper page reads, respectively. The number of errors is substantially lower than in FIG. 13B.

FIG. 13C depicts a plot of a number of errors versus word line position for different types of failures, in a first read situation, where the read voltages are not optimized. The failures involve a transition of a cell from its programmed data state to an adjacent data state—either higher or lower. The failure types include Er→A, A→Er, B→A, C→B, D→C, E→D, F→E and G→F. The highest failure rate, represented by data point 1310, is for A→Er transitions (from the A state to the erased state). The other failure types are depicted by data points 1311.

FIG. 13D depicts a plot of a number of errors versus word line position for different types of failures, in a first read situation, where the read voltages are optimized. In this case, the error count is much lower than in FIG. 13C. The failure types are depicted by data points 1312.

Accordingly, one proposal is to use different sets of read voltages depending on when the block is read. When the block is read the first time after a power up or when a time period since a last sensing operation exceeds a threshold time period, one set of read voltages can be used. For a subsequent read which occurs before a threshold time period has elapsed, one set of read voltages can be used. Further, techniques are provided which allow the system to decide which set of voltages to use. The system can select an optimum set of read voltages on a per block level, in one approach.

Figure 14A:
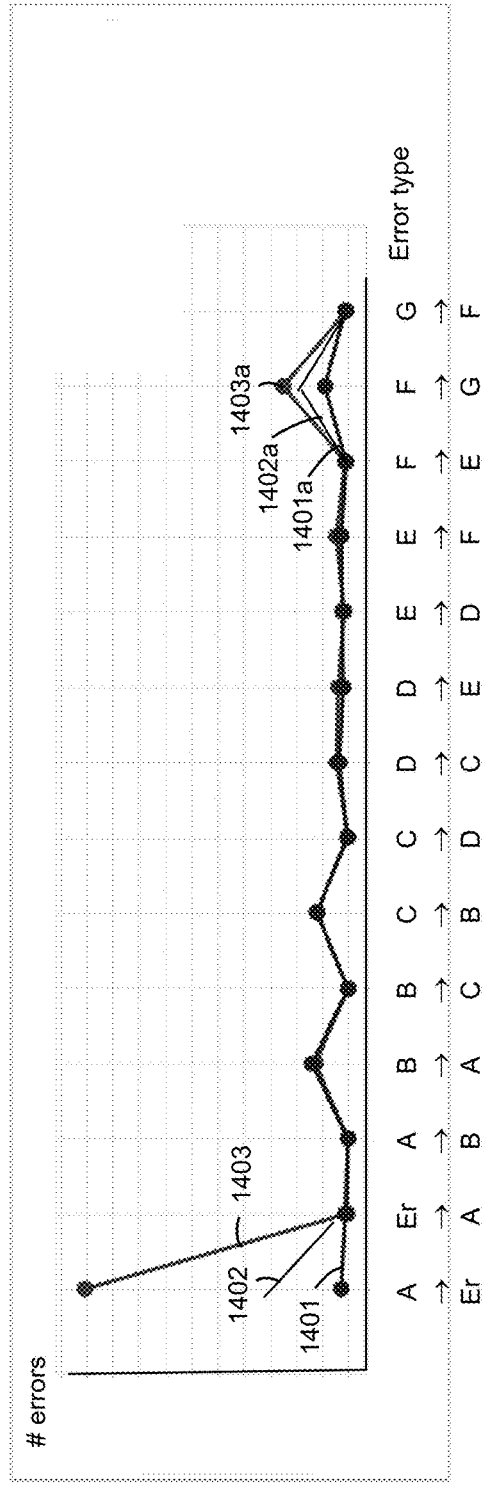
FIG. 14A depicts a plot of a number of errors versus type of failure.

FIG. 14A depicts a plot of a number of errors versus type of failure. The failure types include A→Er, Er→A, A→B, B→A, B→C, C→B, C→D, D→C, D→E, E→D, E→F, F→E, F→G and G→F. The highest number of errors is depicted by plots 1403 and 1403a, which result from reading cells in the first read situation using reference, non-optimized read voltages. A much lower number of errors is depicted by plots 1401 and 1401a which result from reading cells in the first read situation using optimized read voltages. The plots 1402 and 1402a result from reading cells in the second read situation.

Figure 14B:
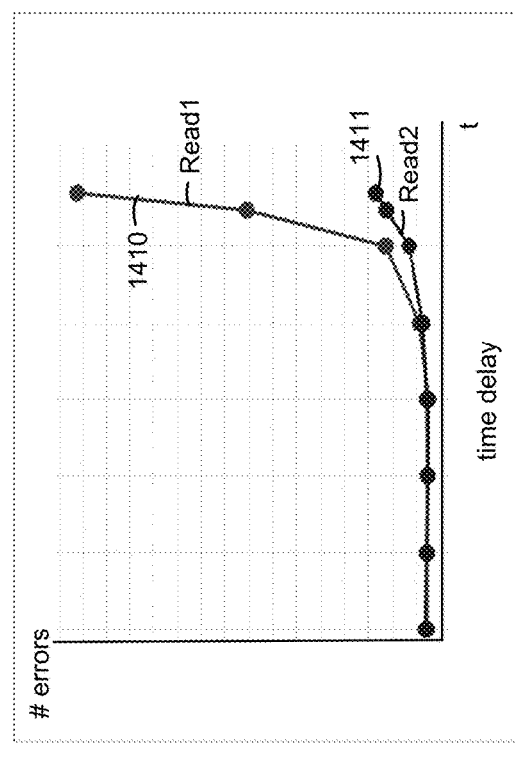
FIG. 14B depicts a plot of a number of errors versus a time delay, for a first read situation (plot 1410) and a second read situation (plot 1411).

FIG. 14B depicts a plot of a number of errors versus a time delay, for a first read situation (plot 1410) and a second read situation (plot 1411). An experiment was performed which involved programming the cells, powering down and then back up, performing two read operations, waiting for a time delay, performing two read operations again and so forth. The time delay is depicted on the horizontal axis. The plots indicate that the first read situation occurs when the time delay exceeds a certain amount. In this case, the number of errors is sharply higher. For the read which occurs immediately after the first read, the second read situation exists and the number of errors is low.

Figure 15A:
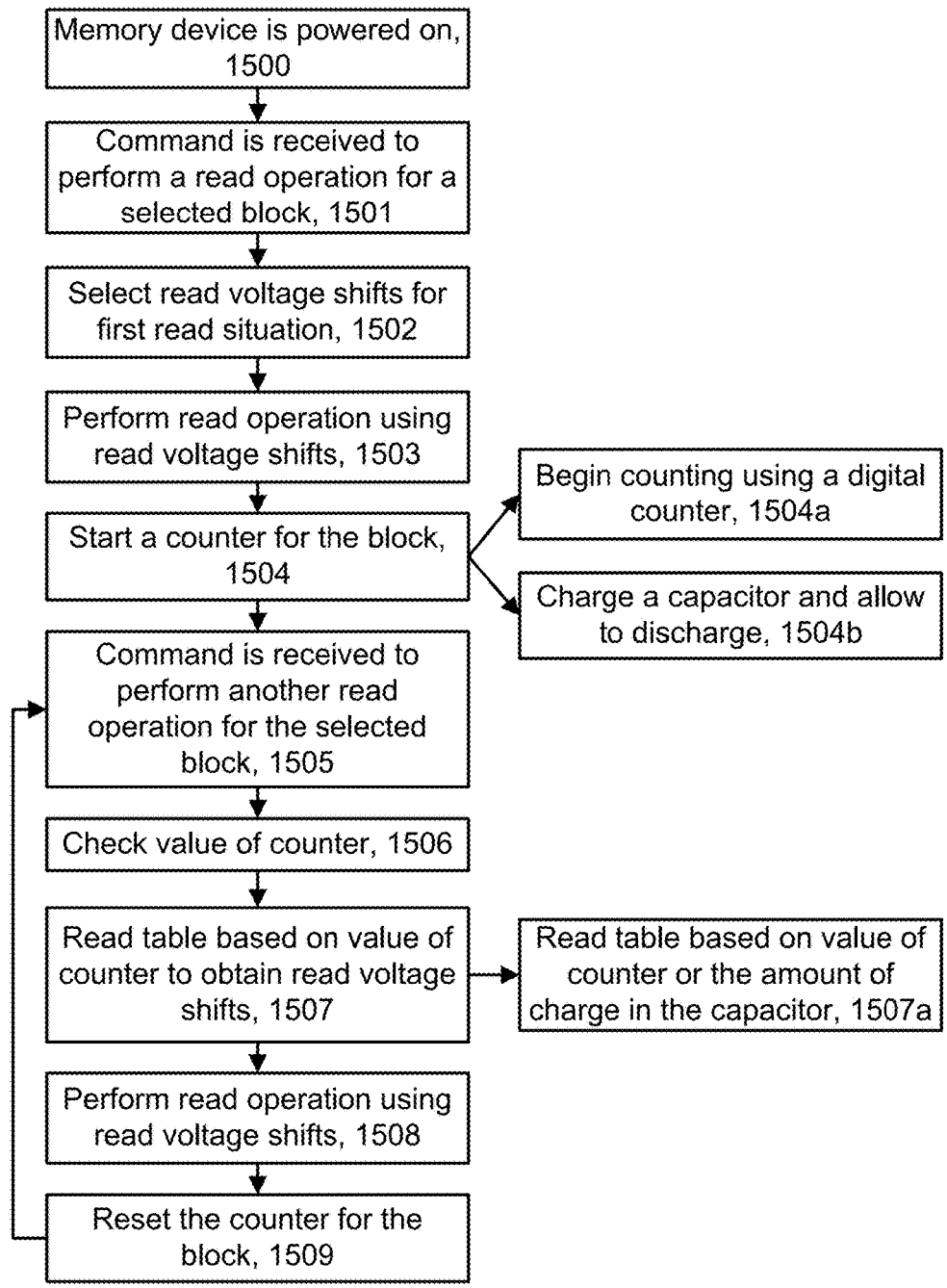
FIG. 15A depicts an example process for setting read voltages based on a time period since a last sensing operation.

FIG. 15A depicts an example process for setting read voltages based on a time period since a last sensing operation. At step 1500, the memory device is powered on. At step 1501, a command is received to perform a read operation for a selected block and a selected word line in the block. The block was programmed before the device was powered off and back on. In one approach, a read command is made by a host device and transmitted to the external controller 122 of FIG. 1A. The external controller in turn instructs the control circuitry 110 to perform the read operation. Step 1502 selects read voltage shifts for a first read situation, e.g., set3a in FIG. 10A or 10B, set7b in FIGS. 10C and 10D or set6b in FIG. 10E. Step 1503 performs a read operation using the read voltage shifts. Step 1504 starts a time for the block. This can include step 1504a, in which counting begins using a digital counter or step 1504*b* in which a capacitor is charged and allowed to discharge.

Sometime later, at step 1505, a command is received to perform another read operation for the selected block. Step 1506 checks the value of the clock to obtain an indication of an amount of time which has passed since the initial read operation. Step 1507 includes reading the table based on the value of the clock to obtain a set of read voltage shifts. This can include reading the table based on the value of the counter or based on an amount of charge in the capacitor, at step 1507*a*. Example tables were discussed in connection with FIG. 10A to 10E. Note that, in place of a table, a computation may be performed which inputs the time and outputs an indication of which set of read voltage shifts to use. Step 1508 performs a read operation using the set of read voltage shifts, and step 1509 resets the counter for the block.

Figure 15B:
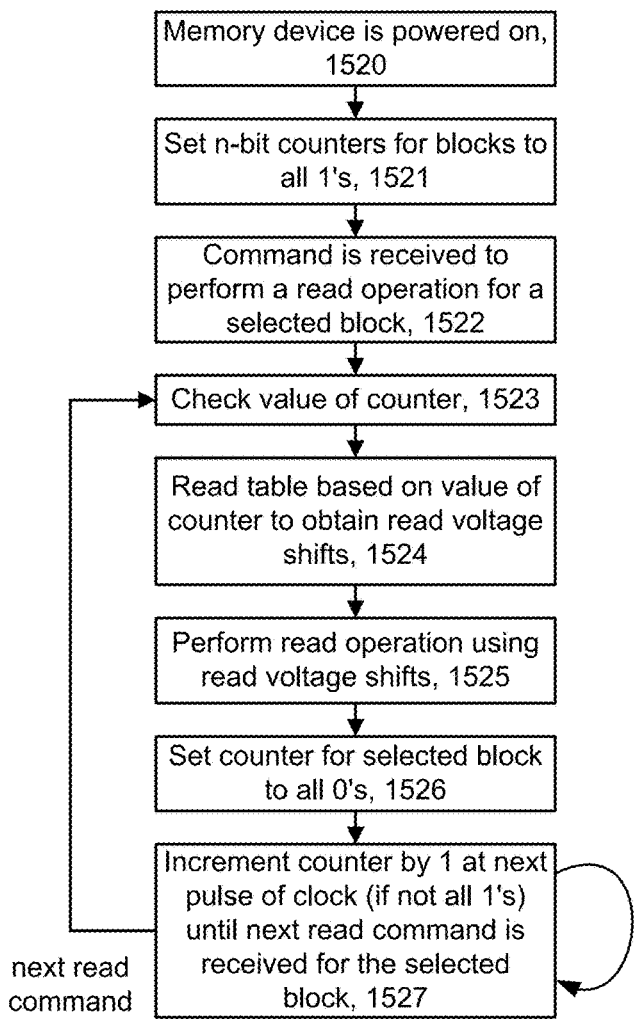
FIG. 15B depicts an example implementation of the process of FIG. 15A using an n-bit counter.

FIG. 15B depicts an example implementation of the process of FIG. 15A using an n-bit counter. At step 1520, the memory device is powered on. Step 1521 sets n-bit counters for the blocks to all 1's, e.g., as in FIG. 10A to 10E. At step 1522, a command is received to perform a read operation for a selected block. Step 1523 checks a value of the counter. Step 1524 reads a table based on the value of the counter to obtain a set of read voltage shifts. Step 1525 performs a read operation using the read voltage shifts. Step 1526 sets the counter for the selected block to all 0's. Step 1527 increments the counter by 1 (a binary 1) at a next pulse of a clock, if the counter is not all 1's already, until a next read command is received from the selected block. The process remains at step 1527 until a next read command is received, at which time the process continues at step 1523. For the next read operation, the current value of the counter is used to select an optimal set of read voltage shifts.

Figure 15C:
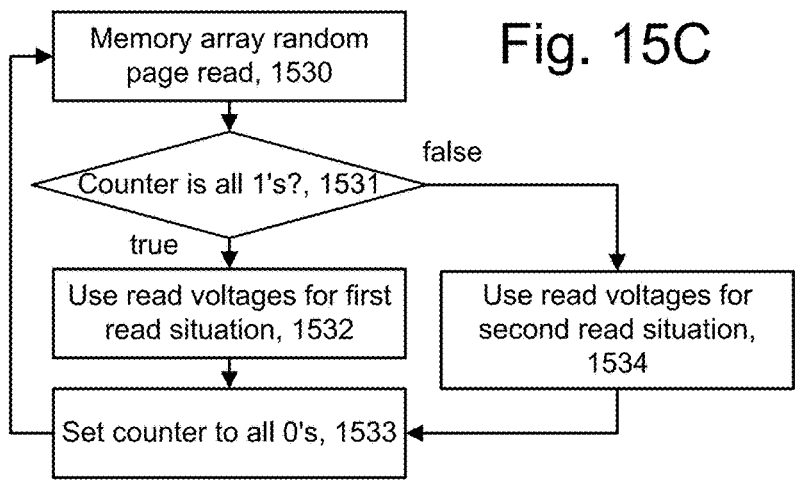
FIG. 15C depicts another example implementation of the process of FIG. 15A using an n-bit counter.

FIG. 15C depicts another example implementation of the process of FIG. 15A using an n-bit counter. Step 1530 indicates that a random page read occurs in a memory array. A decision step 1531 determines whether the counter value is all 1's (e.g., whether the first read condition exists). If decision step 1531 is true, step 1532 uses the read voltages for the first read situation and step 1533 sets the counter to all 0's. If decision step 1531 is false, step 1534 uses the read voltages for the second read situation. Note that the choice to use all 1's and all 0's to denote the first and second read situations, respectively, is one option as other options are possible. Generally, the counter has different binary values which represent different degrees of word line coupling for a block, including the first and second read situations and optionally, one or more intermediate read situations.

This example involves allocating an n-bit counter for each block. The size (n) of the counter depends on the desired granularity of the time measurements and amount of memory to be used for the counters. The state or value of the counter dictates which set of read voltages to use among multiple available sets of read voltages. The counter can be implemented using data saved in DRAM or SRAM (for DRAM-less products), such as RAM 216 in FIG. 2. Whenever the user reads a page of a selected block, firmware in the controller will check the state of the counter corresponding to that block. If the counter is set to all 1's, the system will use the read voltages corresponding to the first read situation. In one approach, consistent with FIGS. 10A and 10C, for all other counter states, the system will use the read voltages corresponding to the second read situation. The counter may be set to all 1's when the memory device is powered on or after a predefined wait time has passed since the previous read or other sensing operation. The size (n) of the counter should be set based on a characteristic wait time in which the first read situation returns after the second read situation.

Figure 16C:
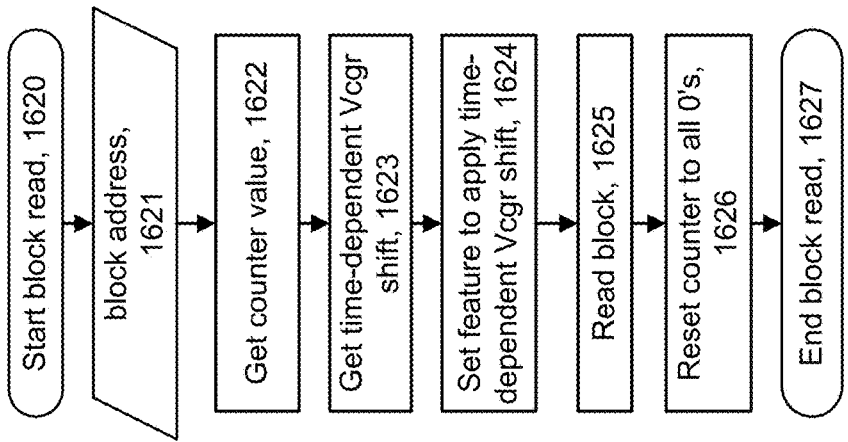
FIG. 16C depicts an example process for providing a read voltage shift which is a function of a time period since a last sensing operation.
Figure 16B:
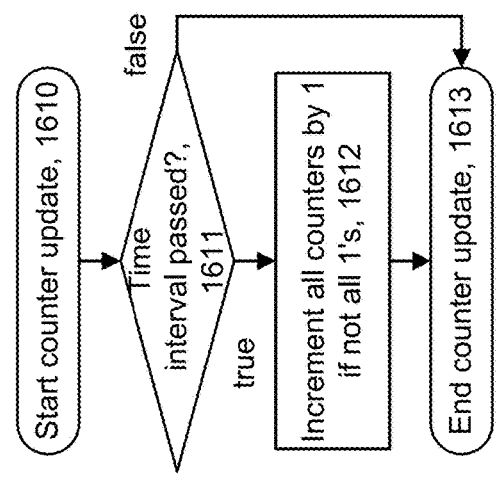
FIG. 16B depicts an example process for updating physical block clocks.
Figure 16A:
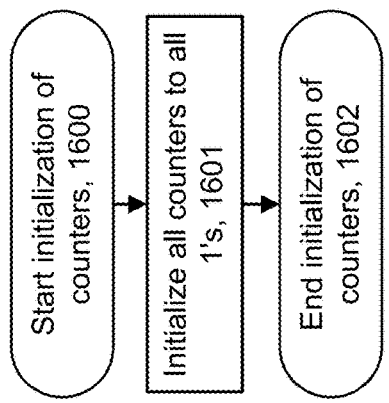
FIG. 16A depicts an example process for initializing counters at a time of power up of the memory device, where the clocks are used to track a time period since a last sensing operation.

FIG. 16A depicts an example process for initializing counters at a time of power up of the memory device, where the counters are used to track a time period since a last sensing operation. The processes of FIG. 16A to 16C may be performed by the controller 122, for instance. Upon system power on, the device is in the first read situation, so the counters are initialized to all 1's. Step 1600 starts an initialization of the counters for the physical blocks. A physical block is a block of cells such as in FIG. 3. Step 1601 initializes all counters to all 1's. Step 1602 ends the initialization of the counters.

FIG. 16B depicts an example process for updating counters. As the block transitions from the second read situation to the first read situation, the counter is incremented to track this transition to allow the system to know to apply a shift to the read voltages. This can be a global update even if the counters are reset at different times. See also FIG. 18A1 to 19. The largest error will be the resolution of the clock which is used to increment the counter, e.g., 20 minutes in the examples of FIGS. 10A and 10B. Step 1610 starts the counter update. Decision step 1611 determines if a specified time interval has passed. If decision step 1611 is true, step 1612 increments all counters by 1, if the counters are not already all 1's. If decision step 1611 is false, step 1613 ends the counter update.

FIG. 16C depicts an example process for providing a read voltage shift which is a function of a time period since a last sensing operation. Based on the value of the counter, a table or other lookup function is accessed which cross-references the time to a set of read voltage shifts. The shifts can comprise binary values of optimal read voltage shifts. By adding a shift to a reference read voltage for each programmed data state, an optimal read voltage is obtained.

Step 1620 starts a physical block read. Step 1621 involves a data input to the controller of a physical block address. Step 1622 involves getting the value of the counter. Step 1623 involves getting the time-dependent Vcgr (read voltage) shift. Step 1624 involves setting a feature to apply the time-dependent Vcgr shift to obtain an optimal read voltage. Step 1625 involves reading the physical block. Step 1626 involves resetting the counter to all 0's. Step 1627 ends the physical block read.

FIG. 17A depicts a set of counters for tracking a time period since a last sensing operation for each of the blocks of FIG. 3. A BLK0 counter 1700, BLK1 counter 1701, BLK2 counter 1702 and BLK3 counter 1703 are depicted. In one approach, each counter has its own respective local clock 1700*a*, 1701*a*, 1702*a* or 1703*a*. However, a more efficient approach is to use one global clock 1720 for all blocks. As described in connection with FIG. 18A1 to 19, the clock controls when the counter will increment to a next value, e.g., when counting back from the second read situation (all 0's) to the first read situation (all 1's). When a local clock is used, it is calibrated to the time of a read operation in a block. When a global clock is used, it is not calibrated to the time of a read operation in a block. This results in some inaccuracy in the time represented by the counter. However, this is an acceptable tradeoff. The clock can operate at a fixed frequency, in one approach.

Optionally, the local or global clock can be adjusted based on a temperature (T) of the memory device. See FIG. 17E. The time for a cell to transition from the second read situation to the first read situation is relatively shorter at relatively higher temperatures. Accordingly, a frequency of the clock can be made relatively higher at relatively higher temperatures. That is, the frequency has a positive temperature coefficient (Tco). Or, the update period of the counter has a negative Tco—the period is shorter when the temperature is higher. The update period can be made smaller by increasing the frequency of the clock which controls the update period or by reducing the n bit value of the counter. For example, with a same update period, an n=2 bit counter will transition from all 0's to all 1's in less time than an n=3 bit counter. Another approach is to have different clocks for different temperature ranges, and to select one clock based on the current temperature range.

Another approach is to use different sets of read voltage shifts for different ranges of temperatures. For example, one set of read voltage shifts can be used when the temperature is below a threshold (Tth), and another set of read voltage shifts can be used when the temperature is above the threshold. See FIG. 17F. Another approach is to use different clocks for different ranges of temperatures. For example, one clock with a lower frequency can be used when the temperature is below a threshold, and another clock with a higher frequency can be used when the temperature is above the threshold.

In one approach, at least one value of a counter is cross-referenced to different sets of read voltage shifts which correspond to different temperature ranges. In another approach, a time period in which a counter transitions from a second value, e.g., all 0's, to a first value, e.g., all 1's, is set according to a (negative) temperature coefficient.

FIG. 17B depicts an example capacitor circuit for tracking a time period since a last sensing operation for each of the blocks of FIG. 17A. As mentioned, a capacitor can be charged and allowed to discharge, where the rate of discharge is known. As a result, the charge level at a given time can be cross-referenced to the discharge time. The circuit 1715 includes a capacitor 1710, a charger 1711 and a charge detector 1712. The charge may include a voltage source, for example. The charge detector may measure a voltage or current of the capacitor, for example.

FIG. 17C depicts a plot of charge (Q) versus a time period since a last sensing operation for the capacitor of FIG. 17B. An example data point shows that the charge is Q1. This is cross-referenced to a time t1 using a discharge curve 1721.

FIG. 17D depicts a plot of data set versus decreasing capacitor charge level. As the charge level decreases, one set of read voltage shifts (SetB) can be used when the charge is above a threshold (Qth), and another set of read voltage shifts (SetA) can be used when the charge is below the threshold. Generally, relatively smaller magnitude shifts can be used when the charge is relatively higher, since the block is relatively close to the second read situation.

FIG. 17E depicts a plot of clock frequency (f) versus temperature (T). As mentioned, a frequency of the clock can be made relatively higher at relatively higher temperatures. This example uses a ramp function to provide a gradual increase in f with T. Other approaches may use a staircase function, for example, to provide a step wise increase in f with T.

FIG. 17F depicts a plot of data set versus temperature. As mentioned, one set of read voltage shifts (SetA) can be used when the temperature is below a threshold (Tth), and another set of read voltage shifts (SetB) can be used when the temperature is above the threshold. Generally, relatively larger magnitude shifts can be used when the temperature is relatively lower so that the magnitude of the voltage shifts has a negative Tco.

FIG. 18A1 depicts example time lines showing selection of sets of read voltage shifts as a function of a time period since a last sensing operation, for a two-bit counter consistent with FIG. 10A or 10B. A time line 1800 includes a plot in which the vertical axis denotes a set of read voltage shifts, consistent with FIG. 10A or 10B, and the horizontal axis denotes time in minutes. A time line 1810 indicates counter values and pulses in case a local clock is used. A time line 1820 indicates counter values and pulses in case a global clock is used. The time axes are aligned in each of the time lines in FIGS. 18A1 and 18A2.

A power on event occurs at t=0 at which time the counter is initialized to 11. A read operation (Read1) occurs at tread1 at which time the counter is set to 00 and begins counting at increments which are set by pulses of the local or global clock. Both the local and global clocks issue pulses at 20 minute intervals in this example, where a pulse causes the counter to transition to a next value in a sequence of values. These intervals occur starting at tread1 if a local clock is used. Local clock pulses occur at tread1+20, tread1+40 and tread1+60, where the counter is set to 01, 10 and 11, respectively. Assuming tread1=30 minutes, the counter is set to 01, 10 and 11 at 50, 70 and 90 minutes, respectively. A further local clock pulse is not issued at tread1+80 (or the pulse is issued but the counter does not change) because the counter is at all 1's. Another read operation (Read2) occurs at tread2 at which time the counter is again set to 00 and begins counting. For example, the local clock issues a pulse at tread2+20, where the counter is set to 01, and so forth. Assuming tread2=125 minutes, the counter is set to 01 at 145 minutes.

If a global clock is used, the relevant pulses are issued at times of 40, 60, 80 and 140 minutes. Pulses issued at 0, 20, 100 and 120 do not change the counter and are depicted in dotted lines. Assuming tread1=30 minutes, the transition of the counter from 00 to 01 will occur 10 minutes after tread1 instead of 20 minutes after (the case of using a local clock). The counter will transition to 10 and 11 at 60 and 80 minutes, respectively. The counter will transition from 00 back to 11 in 50 minutes (80−30) instead of 60 minutes (90−30). However, this error is an acceptable tradeoff for a simplified implementation.

The data points 1801 and 1802 indicate that set3a is selected for Read1 and Read2, respectively.

FIG. 18A2 depicts an example time line similar to FIG. 18A1 except a program operation occurs at tread1 instead of a read operation. A time line 1830 includes a plot in which the vertical axis denotes a set of read voltage shifts, consistent with FIG. 10A or 10B, and the horizontal axis denotes time in minutes. A program operation includes sensing operations (e.g., verify operations), so that it also triggers setting the counter to all 0's. However, no read voltage shifts are needed. The data point 1803 indicates that set3a is selected for the Read at tread2.

Figure 18B:
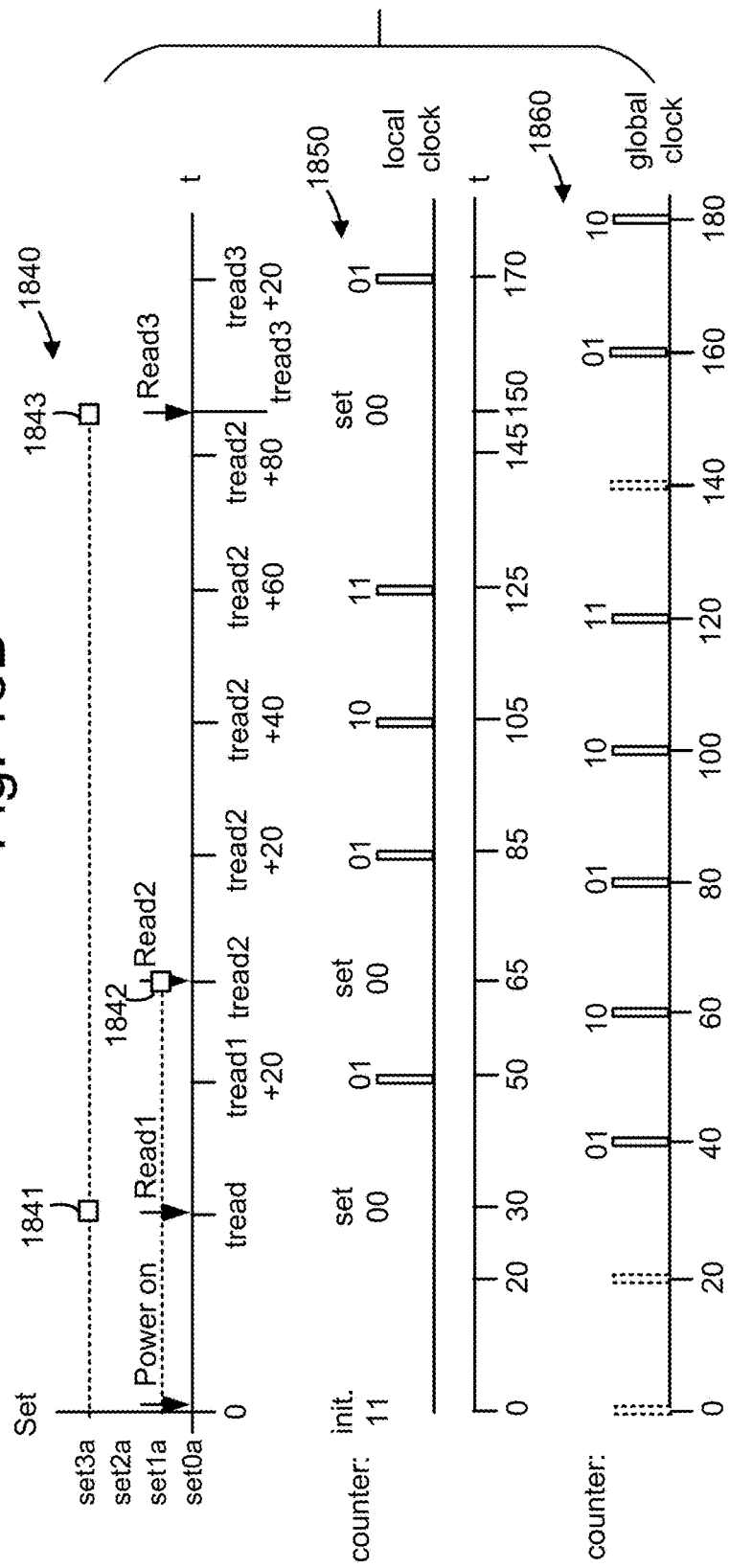
FIG. 18B depicts further example time lines showing selection of sets of read voltage shifts as a function of a time period since a last sensing operation, for a two-bit counter consistent with FIG. 10B.

FIG. 18B depicts further example time lines showing selection of sets of read voltage shifts as a function of a time period since a last sensing operation, for a two-bit counter consistent with FIG. 10B. A time line 1840 includes a plot in which the vertical axis denotes a set of read voltage shifts, consistent with FIG. 10A or 10B, and the horizontal axis denotes time in minutes. A time line 1850 indicates counter values and pulses in case a local clock is used. A time line 1860 indicates counter values and pulses in case a global clock is used. The time axes are aligned.

A power on event occurs at t=0 at which time the counter is initialized to 11. A read operation (Read1) occurs at tread1 at which time the counter is set to 00. A local clock pulse occurs at tread1+20, where the counter is set to 01. Assuming tread1=30 minutes, the counter is set to 01 at 50 minutes. Another read operation (Read2) occurs at tread2 at which time the counter is again set to 00 and begins counting. For example, the local clock issues a pulse at tread2+20, tread2+40 and tread2+60, where the counter is set to 01, 10 and 11, respectively. Assuming tread2=65 minutes, the counter is set to 01, 10 and 11 at 85, 105 and 125 minutes, respectively. A further local clock pulse is not issued at tread2+80 (or the pulse is issued but the counter does not change) because the counter is at all 1's. Another read operation (Read3) occurs at tread3 at which time the counter is again set to 00 and begins counting. For example, the local clock issues a pulse at tread3+20, where the counter is set to 01, and so forth. Assuming tread3=150 minutes, the counter is set to 01 at 170 minutes.

If a global clock is used, the pulses issued at times of 40, 60, 80, 100, 120, 160 and 180 change the counter. Pulses issued at 0, 20 and 140 do not change the counter and are depicted in dotted lines. Assuming tread1=30 minutes, the transition of the counter to 01, 10, 01, 10 and 11 will occur at 10, 30, 50, 70 and 90 minutes after tread1. The first global clock pulse after tread1 is 10 minutes later (40−30). The first global clock pulse after tread2 is 15 minutes later (80−65). The first global clock pulse after tread3 is 10 minutes later (160−150).

The data points 1841, 1842 and 1843 indicate that set3a, set1a and set3a, respectively, are selected for Read1, Read2 and Read3, respectively.

Figure 19:
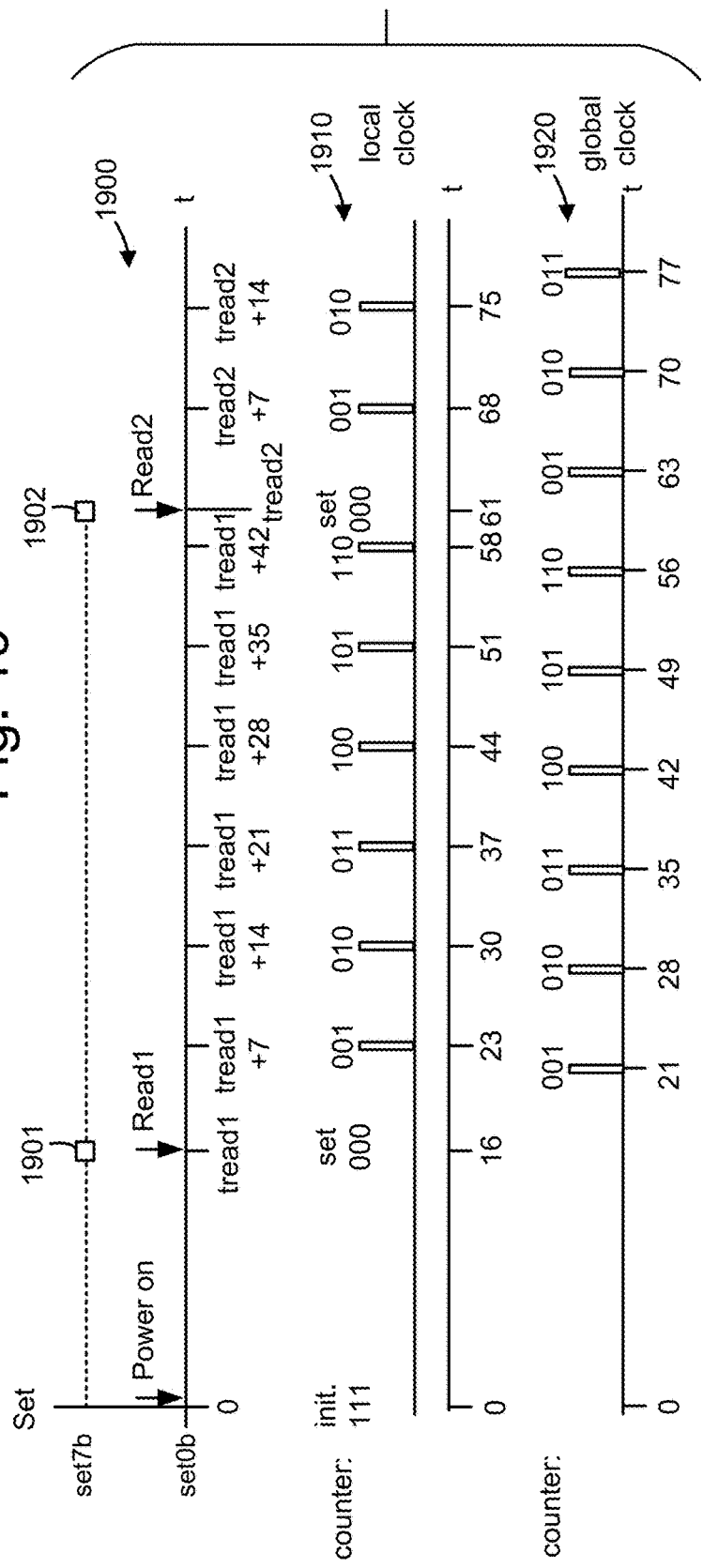
FIG. 19 depicts further example time lines showing selection of sets of read voltage shifts as a function of a time period since a last sensing operation, for a three-bit counter consistent with FIG. 10C, 10D or 10E.

FIG. 19 depicts further example time lines showing selection of sets of read voltage shifts as a function of a time period since a last sensing operation, for a three-bit counter consistent with FIG. 10C, 10D or 10E. A time line 1900 includes a plot in which the vertical axis denotes a set of read voltage shifts, consistent with FIG. 10C, 10D or 10E, and the horizontal axis denotes time in minutes. A time line 1910 indicates counter values and pulses in case a local clock is used. A time line 1920 indicates counter values and pulses in case a global clock is used. The time axes are aligned.

A power on event occurs at t=0 at which time the counter is initialized to 111. A read operation (Read1) occurs at tread1 at which time the counter is set to 000 and begins counting at increments which are set by pulses of the local or global clock. Both the local and global clocks issue pulses at 7 minute intervals in this example, where a pulse causes the counter to transition to a next value in a sequence of values. These intervals occur starting at tread1 if a local clock is used. Local clock pulses occur at tread1+7, tread1+14, tread1+21, tread1+28, tread1+35 and tread1+42, where the counter is set to 001, 010, 011, 100, 101 and 110, respectively. Assuming tread1=16 minutes, the counter is set to 001, 010, 011, 100, 101 and 110 at 23, 30, 37, 44, 51 and 58 minutes, respectively. Another read operation (Read2) occurs at tread2 at which time the counter is again set to 000 and begins counting. For example, the local clock issues a pulse at tread2+7 and tread2+14, where the counter is set to 001 and 010, respectively, and so forth. Assuming tread2=61 minutes, the counter is set to 001 and 010 at 68 and 75 minutes, respectively.

If a global clock is used, the pulse are issued at times of 21, 28, 35, 42, 49, 56, 63, 70 and 77 minutes. Other pulses of the global clock which do not change the counter, e.g., at 0, 7 and 14 minutes, are not depicted. The transition of the counter from 000 to 001 will occur 5 minutes (21−16) after tread1 instead of 7 minutes after (the case of using a local clock).

The data points 1901 and 1902 indicate that set7b is selected for Read1 and Read2, respectively.

Figure 20:
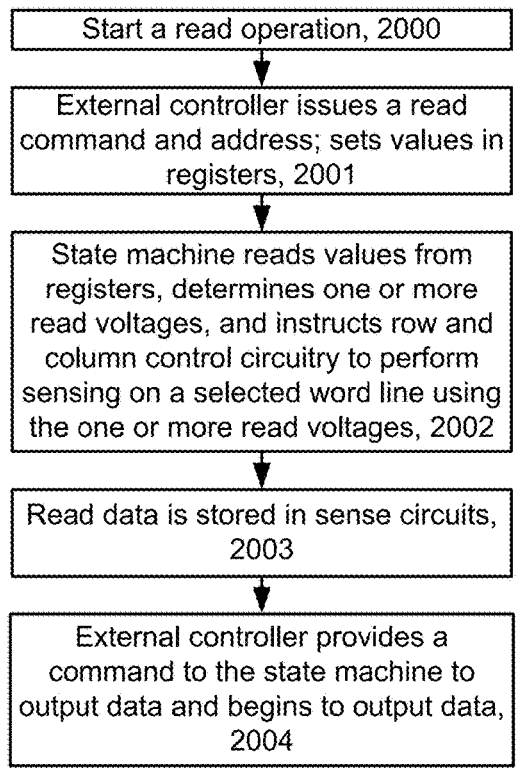
FIG. 20 depicts an example read process in a memory device.

FIG. 20 depicts an example read process in a memory device. Step 2000 is the start of a read operation. In step 2001, the external controller issues a read command and address for a block and word line. For example, the read command and addresses can be provided to a state machine. The read command can identify a read type such as the types of pages to read (e.g., lower, middle, upper, single level cell). Further, the external controller may set the read voltage shifts in registers. In one approach, each plane or set of blocks has a dedicated set of registers.

Addresses for row control circuitry may identify a selected word line in a selected block, and addresses for column control circuitry may select all or a portion of a word line. For example, if multiple pages of data are stored in a word line, the addresses may identify the portion of a word line which stores one page of data. In step 2002, the state machine reads the shifts, determines one or more read voltages, and instructs the row and column control circuitry to perform sensing of memory cells of a selected word line using the one or more read voltages.

For example, the values in the register can be a binary code word which denotes a read voltage or a read voltage shift which can be added to a reference voltage to obtain a read voltage. Each value can be cross-referenced to a read voltage.

For instance, for a read of a lower page, the state machine may instruct the row control circuitry to provide read voltages of VrA and VrE on the selected word line. For a read of a middle page, the state machine may instruct the row control circuitry to provide read voltages of VrB, VrD and VrF on the selected word line. For a read of an upper page, the state machine may instruct the row control circuitry to provide read voltages of VrC and VrG on the selected word line. The column control circuitry is instructed to perform sensing during each read voltage.

At step 2003, the read data is stored in the sense circuits as part of the sensing process. For example, the read data for each memory cell can be a bit which indicates whether the cell was sensed to be in a conductive or non-conductive state. At step 2004, the external controller provides a command to the state machine to output data and begins to output data.

Figure 21:
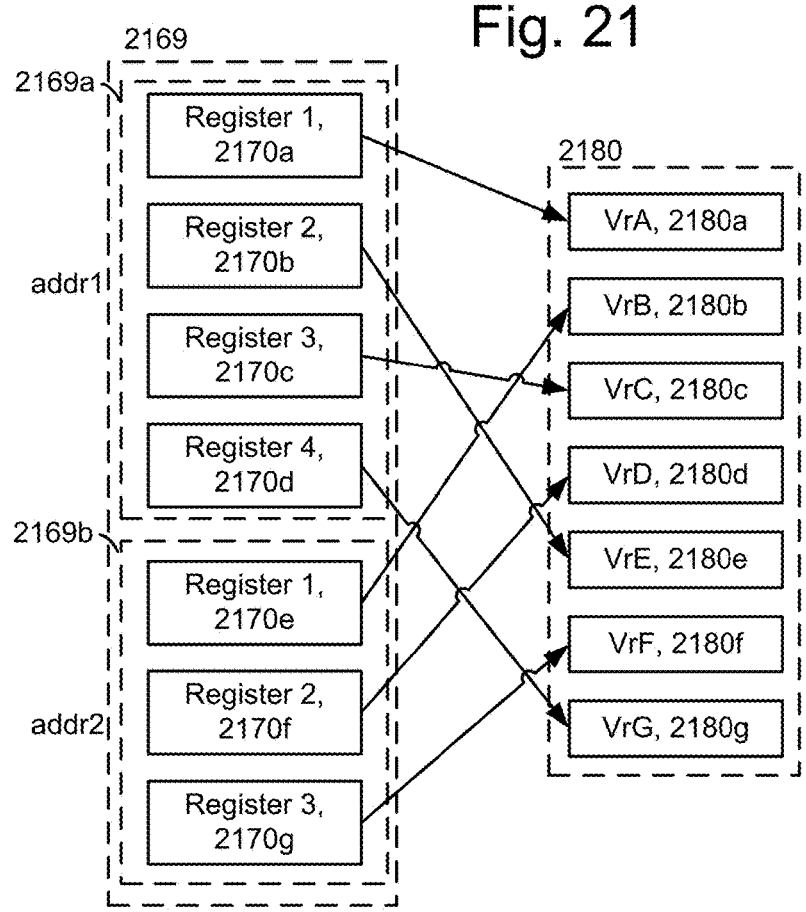
FIG. 21 depicts a mapping between registers and data states, consistent with FIG. 20.

FIG. 21 depicts a mapping between registers and data states, consistent with FIG. 20. A module 2169 includes sets of registers 2169a and 2169b associated with addresses addr1 and addr2, respectively. The set of registers 2169a includes register1 2170a, register2 2170b, register3 2170c and register4 2170d. The set of registers 2169b includes register1 2170e, register2 2170f and register3 2170g. A set of internal registers 2180 of the state machine is also depicted, including registers 2180a, 2180b, 2180c, 2180d, 2180e, 2180f and 2180g which store read voltages such as VrA, VrB, VrC, VrD, VrE, VrF and VrG, respectively. Further, the registers in the module 2169 are mapped to the registers in the state machine as indicated by the arrows. Specifically, register1 2170a, register2 2170b, register3 2170c, register4 2170d, register1 2170e, register2 2170f and register3 2170g are mapped to registers 2180a, 2180e, 2180c, 2180g, 2180b, 2180d and 2180f, respectively. This indicates how the values in the registers are used to provide read voltages.

Figure 22:
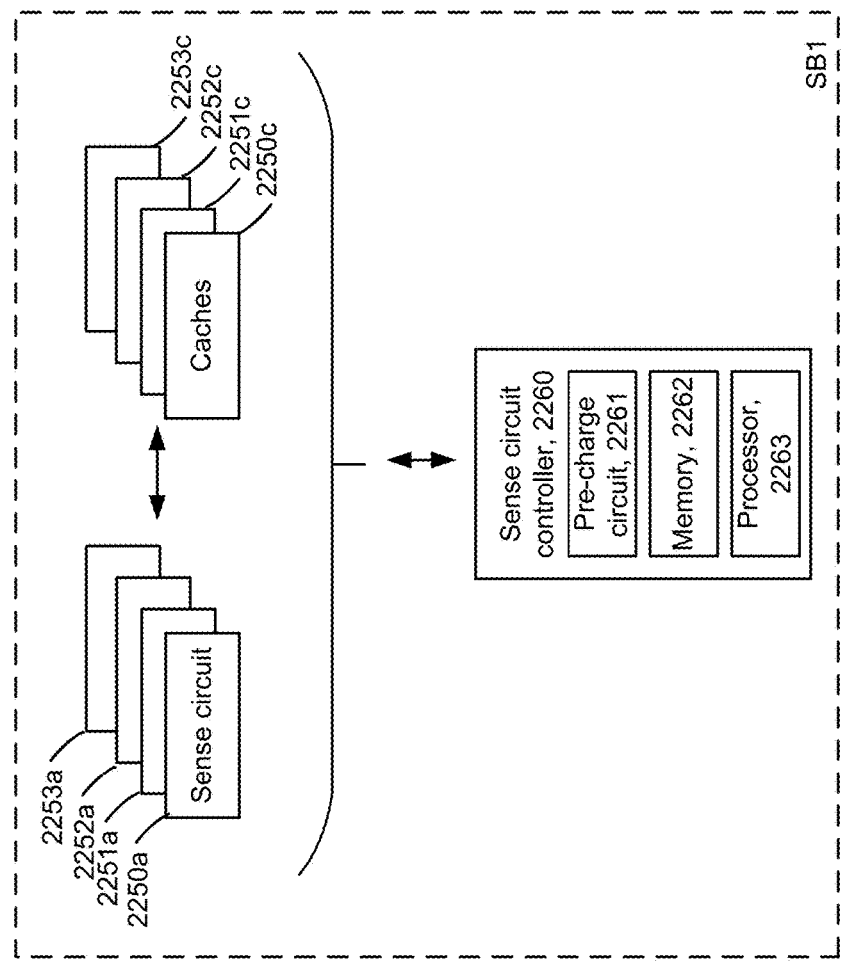
FIG. 22 depicts an example block diagram of a sense block SB1 in the column control circuitry of FIG. 1A.

FIG. 22 depicts an example block diagram of a sense block SB1 in the column control circuitry of FIG. 1A. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 2250a, 2251a, 2252a and 2253a are associated with caches 2250c, 2251c, 2252c and 2253c, respectively.

In one approach, different subsets of bit lines can be sensed using different respective sense blocks. This allows the processing load which is associated with the sense circuits to be divided up and handled by a respective processor in each sense block. For example, a sense circuit controller 2260 can communicate with the set, e.g., sixteen, of sense circuits and latches. The sense circuit controller may include a pre-charge circuit 2261 which provides a voltage to each sense circuit for setting a pre-charge voltage. The sense circuit controller may also include a memory 2262 and a processor 2263.

Figure 23:
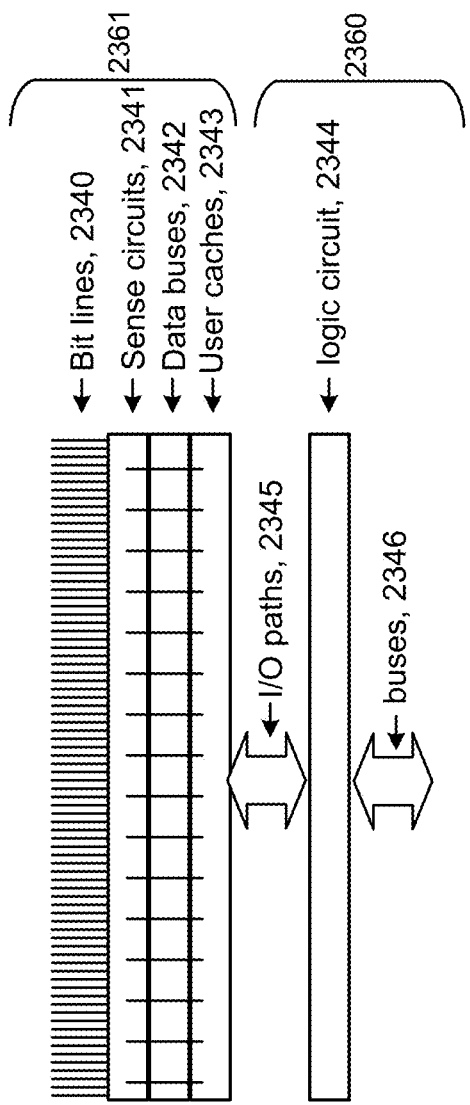
FIG. 23 depicts an example sensing circuit and input/output circuitry consistent with FIG. 22.

FIG. 23 depicts an example sensing circuit and input/output circuitry consistent with FIG. 22. The sensing circuit 2361 includes a set of bits lines 2340, sense circuits 2341, data buses 2342 (DBUS), and user caches 2343. An input/output circuit 2360 comprises input/output paths 2345, a logic circuit 2344 and buses 2346 for communicating with an external host, external to the memory chip. The buses may extend to I/O pads on the chip. In one approach, a bit size of the input/output paths in bits is equal to a bit size of a word. The transfer of data to and from the sense circuits may occur separately for each page of data.

Figure 24:
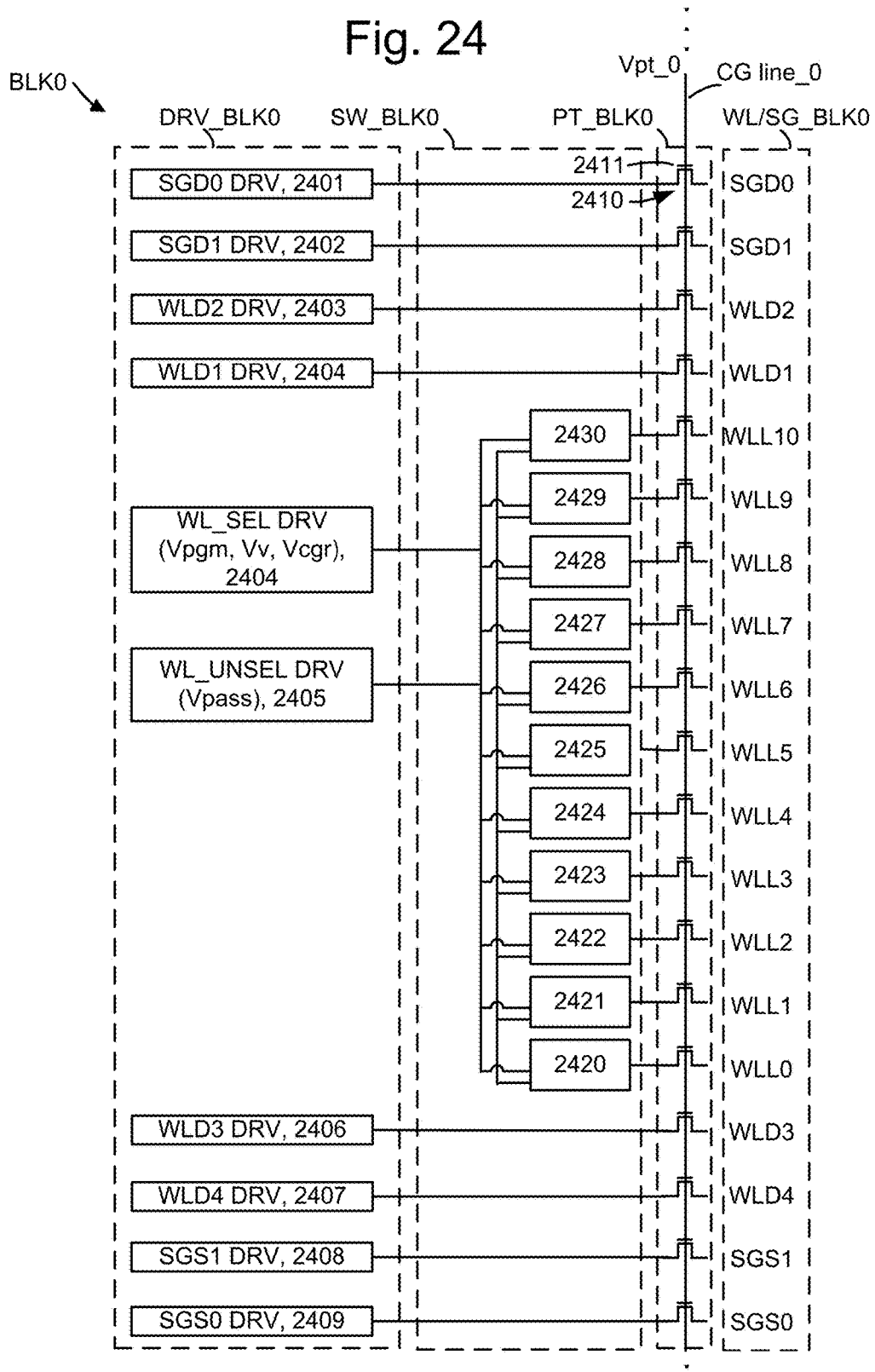
FIG. 24 depicts an example circuit which includes voltage drivers DRV_BLK0, switches SW_BLK0, pass transistors PT_BLK0 and word lines and select gate lines WL/SG_BLK0 of BLK0.

FIG. 24 depicts an example circuit which includes voltage drivers DRV_BLK0, switches SW_BLK0, pass transistors PT_BLK0 and word lines and select gate lines WL/SG-_BLK0 of BLK0. DRV_BLK0 includes various voltage drivers, such as charge pumps. These may be provided as part of the power control module 116 of FIG. 1A, for example. An SGD0 driver 2401 provides a voltage to an SGD0 control line. An SGD1 driver 2402 provides a voltage to an SGD1 control line. A WLD2 driver 2403 provides a voltage to a WLD2 word line. A WLD1 driver 2404 provides a voltage to a WLD1 word line. A WL_SEL driver 2404 provides a voltage to any of the data word lines WLL0-WLL10 which is selected for programming or reading. These voltages could include a program voltage Vpgm, a verify voltage Vv, and a read voltage Vcgr. Optionally, separate voltage drivers can be provided for these voltages.

A WL_UNSEL driver 2405 provides a voltage to any of the data word lines WLL0-WLL10 which is unselected. These voltages could include a pass voltage Vpass.

A WLD3 driver 2406 provides a voltage to a WLD3 word line. A WLD4 driver 2407 provides a voltage to a WLD4 word line. An SGS1 driver 2408 provides a voltage to an SGS1 control line. An SGS0 driver 2409 provides a voltage to an SGS0 control line.

A set of switches 2420-2430 in SW_BLK0 are responsive to control signals to pass the voltage from one of the drivers 2404 or 2405 to the respective data word line. Switches 2420, 2421, 2422, 2423, 2424, 2425, 2426, 2427, 2428, 2429 and 2430 are used for word lines WLL0-WLL10, respectively. The switches 2420-2430 can also be controlled to disconnect a driver from the respective data word line. For example, a driver can be disconnected to float the voltages of the data word lines as discussed to allow coupling up of the voltages.

PT_BLK0 includes an example pass transistor 2410 having a control gate 2411. As mentioned, the control gates of the pass transistors in a group of blocks are connected to one another and receive a common control gate voltage, e.g., Vpt_0.

Figure 25:
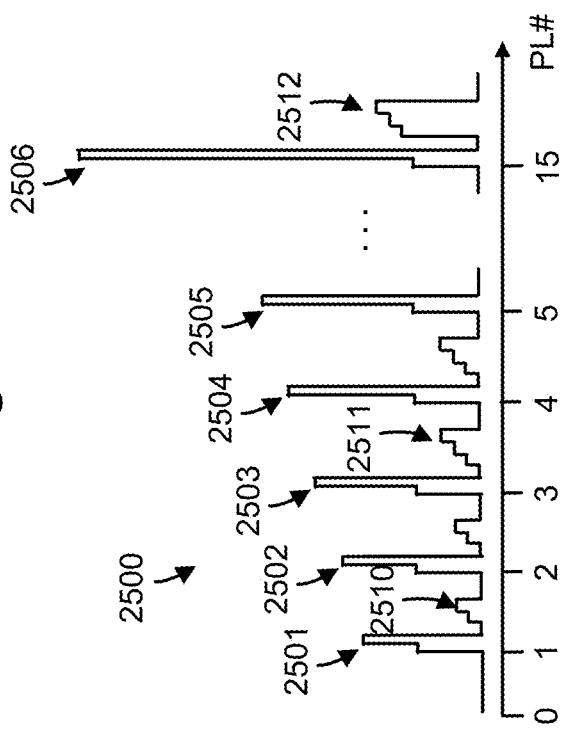
FIG. 25 depicts a waveform of an example programming operation.

FIG. 25 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 2500 includes a series of program voltages 2501, 2502, 2503, 2504, 2505, . . . 2506 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 2510) may be applied after each of the program voltages 2501 and 2502. A-, B- and C-state verify voltages of VvA, VvB and VvC (waveform 2511) may be applied after each of the program voltages 2503 and 2504. After several additional program loops, not shown, E-, F- and G-state verify voltages of VvE, VvF and VvG (waveform 2512) may be applied after the final program voltage 2506.

In one embodiment, a method comprises: providing a counter for each block of a plurality of blocks of memory cells; in response to a read command involving a selected block among the plurality of blocks, determining a value of the counter for the selected block and reading the selected block using read voltages which are set based on the value of the counter for the selected block; and periodically incrementing the counters of the plurality of blocks using a global clock.

In another embodiment, an apparatus comprises: a capacitor (1710); means for storing a plurality of available sets of read voltage shifts for a block of memory cells (216); means for charging up a voltage of the capacitor in response to a power on event involving the block (1711), the voltage of the capacitor decaying over time; means for, in response to a read command involving the block, identifying a set of read voltage shifts among the plurality of available sets of read voltage shifts based on the voltage of the capacitor (e.g., tables of FIG. 10A-10E, charge detector 1712); and means for reading the block using read voltages which are based on the set of read voltage shifts (e.g., FIG. 21-24).

The means described above can include the components of the memory device 100 of FIG. 1A and FIG. 2, for example. The power control module 116, for instance, controls the power and voltages supplied to the word lines, select gate lines and bit lines during memory operations. Moreover, the means described above can include the components of FIGS. 18A1 and 18B including the voltage drivers, switches and pass transistors. The means for controlling can include any of the control circuits in FIGS. 1A and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a storage device comprising a counter for a block of memory cells, wherein different values of the counter identify different sets of read voltage shifts for the block; and
   a controller, the controller is configured to:
      in response to a power on event involving the block, set the counter to a first value which is cross-referenced to a largest set of read voltage shifts from among the different sets of read voltage shifts; and
      in response to a sensing operation in the block, set the counter to a second value which is cross-referenced to a smallest set of read voltage shifts from among the different sets of read voltage, and periodically increment the counter.

2. The apparatus of claim 1, wherein:
   the memory cells are programmed to different programmed data states comprising a lowest programmed data state and a highest programmed data state; and
   the largest set of read voltage shifts comprise a negative read voltage shift for the lowest programmed data state and a positive read voltage shift for the highest programmed data state.

3. The apparatus of claim 1, wherein:
   the controller is configured to increment the counter to one or more intermediate values which are between the first value and the second value, each of the one or more intermediate values is cross-referenced to the smallest set of read voltage shifts; and
   in response to a read command received while the counter has the one or more intermediate values, the controller is configured to cause a read operation involving the block using the smallest set of read voltage shifts.

4. The apparatus of claim 1, wherein:
   the controller is configured to increment the counter to an intermediate value which is between the first value and the second value, the intermediate value is cross-referenced to an intermediate set of read voltage shifts from among the different sets of read voltage shifts.

5. The apparatus of claim 4, wherein:
   a magnitude of a largest read voltage shift in the intermediate set of read voltage shifts is smaller than a magnitude of a largest read voltage shift in the largest set of read voltage shifts and larger than a magnitude of a largest read voltage shift in the smallest set of read voltage shifts.

6. The apparatus of claim 4, wherein:
   in response to a read command received while the counter has the intermediate value, the controller is configured to cause a read operation involving the block using the intermediate set of read voltage shifts.

7. The apparatus of claim 1, wherein:
   in response to a read command received while the counter has the first value, the controller is configured to cause a read operation involving the block using the largest set of read voltage shifts.

8. The apparatus of claim 1, wherein:
   in response to a read command received while the counter has the second value, the controller is configured to cause a read operation involving the block using the smallest set of read voltage shifts.

9. The apparatus of claim 1, wherein:
   at least one value of the counter is cross-referenced to different sets of read voltage shifts which correspond to different temperature ranges.

10. The apparatus of claim 1, wherein:
    a time period in which the counter transitions from the second value to the first value is set according to a temperature coefficient.

11. The apparatus of claim 1, wherein:
    the block is among a plurality of blocks of memory cells;
    the storage device comprises a counter for each block of the plurality of blocks; and
    the controller is configured to implement a global clock which periodically increments the counters of the plurality of blocks.

12. The apparatus of claim 1, wherein:
    the block of memory cells comprises a stack of alternating control gate and dielectric layers, including one group of control gate layers below another group of control gate layers;
    the memory cells are arranged in vertically extending memory holes in the stack;
    the memory holes have a width which increases with a height in the stack; and
    the different sets of read voltage shifts comprise one group of sets of read voltage shifts for the one group of control gate layers and another group of sets of read voltage shifts for the another group of control gate layers.

13. A method, comprising:
    providing a counter for each block of a plurality of blocks of memory cells;
    in response to a read command involving a selected block among the plurality of blocks, determining a value of the counter for the selected block, selecting a set of read voltages from among a plurality of sets of read voltages based on the value of the counter for the selected block, and reading the selected block using the selected set of read voltages; and
    periodically incrementing the counters of the plurality of blocks using a global clock.

14. The method of claim 13, further comprising:
    in response to a power on event involving the plurality of blocks, setting the counters to a first value; and
    in response to a read command involving the selected block which is received while the counter for the selected block has the first value, reading the selected block using a largest set of read voltage shifts among a plurality of available sets of read voltage shifts.

15. The method of claim 14, wherein the counter of the select block is incremented to a second value, the method further comprising:
    in response to a read command involving the selected block which is received while the counter has the second value, reading the selected block using a smallest set of read voltage shifts among the plurality of available sets of read voltage shifts.

16. The method of claim 13, wherein:
different counters of the plurality of blocks have different values according to a time of a last sensing operation in the different blocks.

17. An apparatus, comprising:
a capacitor;
means for storing a plurality of available sets of read voltage shifts for a block of memory cells;
means for charging up a voltage of the capacitor in response to a power on event involving the block, the voltage of the capacitor decaying over time;
means for, in response to a read command involving the block, identifying a set of read voltage shifts among the plurality of available sets of read voltage shifts based on the voltage of the capacitor; and
means for reading the block using read voltages which are based on the set of read voltage shifts.

18. The apparatus of claim 17, further comprising:
means for mapping different ranges of the voltage to different sets of read voltage shifts among the plurality of available sets of read voltage shifts.

19. The apparatus of claim 17, wherein:
a relatively high value of the voltage is cross-referenced to a set of relatively high read voltage shifts among the plurality of available sets of read voltage shifts; and
a relatively low value of the voltage is cross-referenced to a set of relatively low read voltage shifts among the plurality of available sets of read voltage shifts.

20. The apparatus of claim 17, further comprising:
means for charging up the voltage of the capacitor in response to reading of the block.

\* \* \* \* \*